US012568588B1

(12) United States Patent
Nanbakhsh et al.

(10) Patent No.: US 12,568,588 B1
(45) Date of Patent: Mar. 3, 2026

(54) CIRCUIT BOARD WITH A PARTIAL SOLDER-MASK AND AT LEAST ONE CONFORMAL-COATING

(71) Applicant: Salvia BioElectronics B.V., Eindhoven (NL)

(72) Inventors: Kambiz Nanbakhsh, Eindhoven (NL); Steve Gee, Posterholt (NL); Hubert Martens, Waalre (NL); Daniel Schobben, Waalre (NL)

(73) Assignee: Salvia BioElectronics B.V., Eindhoven (NL)

( * ) Notice: Subject to any disclaimer, the term of this patent is extended or adjusted under 35 U.S.C. 154(b) by 0 days.

(21) Appl. No.: 19/281,329

(22) Filed: Jul. 25, 2025

(51) Int. Cl.
*H05K 1/11* (2006.01)
*H05K 3/3452* (2026.01)
*H05K 3/40* (2006.01)

(52) U.S. Cl.
CPC ........... *H05K 3/3452* (2013.01); *H05K 1/111* (2013.01); *H05K 3/4007* (2013.01); *H05K 2201/0989* (2013.01); *H05K 2203/0264* (2013.01)

(58) Field of Classification Search
CPC .............. H05K 3/3452; H05K 3/4007; H05K 2201/0989; H05K 2203/0264
See application file for complete search history.

(56) References Cited

U.S. PATENT DOCUMENTS

2011/0241221 A1 * 10/2011 Ogata ..................... H01L 24/32
257/778

* cited by examiner

*Primary Examiner* — Jeremy C Norris
(74) *Attorney, Agent, or Firm* — Fresh IP PLC; Clifford D. Hyra; Aubrey Y. Chen

(57) ABSTRACT

Circuit boards have a complex surface topology, which can lead to uneven coating thicknesses and inconsistent adhesion. To improve coating reliability, a circuit board is provided with a surface including a conductive-trace extending between a first solder-pad and a third pad. A solder-mask region covers a portion of the conductive-trace. A second solder-pad is provided, adjacent to a mask-free region arranged to be free of solder mask. The first solder-pad and second solder-pad are each arranged to retain at least one electrical connection of the same electrical component. A conformal-coating is provided to cover at least the solder-mask region and the mask-free region. By greatly reducing or minimizing the use of solder-mask in the region covered by the conformal-coating, encapsulation quality can be improved.

21 Claims, 32 Drawing Sheets

CIRCUIT BOARD WITH A PARTIAL SOLDER-MASK AND AT LEAST ONE CONFORMAL-COATING

FIELD

The present disclosure relates to a circuit board comprising at least one substrate and at least one conformal coating, disposed over at least a portion of the at least one substrate. In particular, this disclosure relates to a circuit board comprising at least one substrate with a first surface.

BACKGROUND

Electronic devices subject to hostile environments require a protection method to protect against unwanted ingress of fluids and contaminants. Hostile environments include immersion, high pressure, high heat, and/or high pressure. For example, implantable devices require means to protect the electronics from bodily fluids present in human or animal bodies. Bodily fluids typically contain ions that can cause electrochemical reactions, like corrosion, in the presence of an electric current. Encapsulation using one or more conformal layers is thus a critical component for the design of a medical device—it acts as a barrier between these ionic fluids and critical electronic/electric interfaces to reduce and/or prevent degradation of the implant electronics.

Polyimides are popular for use as a circuit board substrate material for the microfabrication of electronics, and attempts have been made to encapsulate polyimides with silicone rubber encapsulants, such as polydimethylsiloxane rubber (PDMS). Although PDMS can be substantially biocompatible, causing minimal tissue reaction while having a relatively long period of biostability, it still has a relatively high permeability to moisture which can lead to degradation of the implant electronics.

In addition, circuit boards have a complex and uneven surface topology, which can lead to uneven coating thicknesses and/or inconsistent adhesion.

SUMMARY

To this end, the circuit board comprises at least one conformal-coating arranged to cover at least a portion of the first surface;

wherein the first surface comprises at least one first solder-pad and at least one second solder-pad, each being arranged to retain at least one electrical connection of an electrical component; wherein the first surface comprises at least one third pad; wherein the first surface comprises at least one conductive-trace extending between the at least one first solder-pad and the at least one third pad;

wherein the first surface comprises at least one solder-mask region, arranged to cover at least a portion of the at least one conductive-trace;

wherein the first surface comprises at least one mask-free region, adjacent to the at least one second solder-pad;

wherein the at least one conformal-coating is in contact with at least a portion of the first surface in the at least one mask-free region; and wherein the at least one conformal-coating is in contact with at least a portion of solder-mask in the at least one solder-mask region.

The devices and methods provided in this disclosure are based upon the insight that encapsulation can be improved by greatly reducing and/or minimizing a use of solder-mask in at least one region covered by a conformal-coating. In conventional circuit board manufacturing, solder-masking is an essential step to control solder wetting during assembly, and solder-mask is conventionally applied to almost the whole top surface of the circuit board. However, the inventors have determined that this conventional use of solder-mask frequently leads to voids and/or gaps under the conformal-coating, particularly between edges of a solder-mask region and adjacent components and/or adjacent component electrical connections. Such voids or gaps can collect moisture and/or contaminants, potentially leading to problems such as corrosion, cracking of the conformal-coating, or delaminating of the conformal-coating.

By reducing and/or minimizing a use of at least one solder-mask region to control, reduce and/or prevent a degree of solder wetting along at least one conductive-trace, and by also not using solder-mask in at least one adjacent mask-free region, at least a portion of the at least one solder-mask region can be more reliably encapsulated. A mask-free region is a region of a surface which is arranged to be free, or substantially free, of solder-mask.

For example, a more reliable encapsulation can be possible by providing at least one conformal-coating to cover at least a portion of the at least one solder-mask region and at least a portion of the at least one adjacent mask-free region. For example, a more reliable encapsulation can be possible by arranging the at least one solder-mask region to form an island of solder-mask under at least one conformal-coating, wherein at least a portion of the at least one adjacent mask-free region extends along a perimeter of the at least one solder-mask region.

Greatly reducing and/or minimizing the use of solder-mask is particularly advantageous in areas proximate to electrical connections for components.

Optionally, adhesion of the at least one conformal-coating can be improved by using one or more suitable cleaning and/or surface preparation steps. Additionally or alternatively, adhesion of the at least one conformal-coating can be improved by selecting one or more materials which are suitable for adhesion to at least one mask-free region of the first surface of the circuit board. Additionally or alternatively, adhesion of the at least one conformal-coating can be improved by selecting one or more materials which are suitable for adhesion to the at least one solder-mask region.

Optionally, it can be advantageous to arrange at least a portion of a mask-free region to allow and/or promote a solder-wetting flow.

Optionally, for any circuit board disclosed herein, the circuit board is arranged to be at least partially implantable.

Optionally, for any circuit board disclosed herein, the at least one solder-mask region is arranged to cover at least a portion of the third pad.

Optionally, for any circuit board disclosed herein, the at least one conformal-coating is arranged to cover at least a portion of the at least one first solder-pad, such that the at least one conformal-coating is in contact with at least a portion of the at least one first solder-pad.

Optionally, for any circuit board disclosed herein, the at least one conformal-coating is arranged to cover at least a portion of the at least one second solder-pad, such that the at least one conformal-coating is in contact with at least a portion of the at least one second solder-pad.

Optionally, for any circuit board disclosed herein, the at least one conformal-coating is arranged to cover at least a portion of the at least one third pad, such that the at least one conformal-coating is in contact with at least a portion of the at least one third pad.

Optionally, for any circuit board disclosed herein, the at least one first solder-pad and the at least one second solder-pad are arranged to be adjacent, or immediately adjacent, to each other.

Optionally, for any circuit board disclosed herein, the at least one second solder-pad is arranged to be adjacent to at least one trace-free region.

Optionally, for any circuit board disclosed herein, the first surface comprises at least one further mask-free region, arranged between the at least one solder-mask region and the at least one first solder-pad.

Optionally, it can be advantageous to arrange at least a portion of the further mask-free region to allow and/or promote a solder flow and/or solder-wetting flow by reducing and/or minimizing a use of solder-mask.

Optionally, for any circuit board disclosed herein, the at least one further mask-free region is arranged to provide a minimum separation of at least 0.04 mm between the at least one solder-mask region and the at least one first solder-pad.

Optionally, for any circuit board disclosed herein, the at least one mask-free region, at least one further mask-free region, the at least one solder-mask region, or any combination thereof, are arranged to be at least partially trace-free.

A trace-free region is a region of a surface which is arranged to be free, or substantially free, of traces and conductive-traces. This can be advantageous because voids and/or gaps in a conformal-coating can be reduced by limiting or avoiding circuit board features comprised in the first surface, such as traces and/or conductive-traces.

By providing more trace-free regions, variations in surface topology and surface height can be reduced. In addition, adhesion of the at least one conformal-coating can be improved by selecting one or more materials which are suitable for adhesion to the trace-free regions of the first surface of the circuit board.

A higher degree of reduction in surface topology and surface height can be reduced by providing more regions that are both mask-free and trace-free. In addition, adhesion of the at least one conformal-coating can be improved by selecting one or more materials which are suitable for adhesion to the combined mask-free and trace-free regions of the first surface of the circuit board.

Optionally, for any circuit board disclosed herein, the at least one first solder-pad comprises at least one through-hole and/or at least one via.

Optionally, for any circuit board disclosed herein, the at least one second solder-pad comprises at least one through-hole and/or at least one via.

Optionally, for any circuit board disclosed herein, the at least one third pad comprises at least one through-hole and/or at least one via.

Optionally, for any circuit board disclosed herein, the third pad is arranged as a solder-pad for retaining at least one electrical connection of an electrical component.

Optionally, for any circuit board disclosed herein, the at least one solder-mask region is arranged to be at least partially removable after solder has been applied to at least a portion of the at least one first solder-pad, to at least a portion of the at least one conductive-trace, to at least a portion of the at least one second solder-pad, to at least a portion of the at least one third pad, or any combination thereof.

Optionally, for any circuit board disclosed herein, the first solder-pad and/or the second solder-pad are arranged to retain an SMD electrical connection, a BGA electrical connection, a lead electrical connection, or any combination thereof.

Optionally, for any circuit board disclosed herein, the at least one conformal-coating is arranged to cover a conformal-coating area (C) of at least a portion of the first surface;

wherein the at least one conformal-coating is arranged to cover a solder-mask area (M) of one or more portions of the at least one solder-mask region; and wherein the solder-mask area (M) compared to the conformal-coating area (C) is in the range of 1% to 50%, or 1% to 40%, or 1% to 30%, or 1% to 25%, or 1% to 20%, or 1% to 15%, or 1% to 10%, or 1% to 7.5%, or 1% to 5%, or 1% to 2.5%, or approximately 18.

For example, a more reliable encapsulation can be possible by arranging the at least one conformal-coating to cover at least a portion of the at least one solder-mask region, such that the conformal-coating area is greater than the portion of the solder-mask area, or substantially greater than the portion of the solder-mask area. The solder-mask area can comprise one or more contiguous and/or non-contiguous solder-mask regions. The conformal-coating area can comprise one or more contiguous and/or non-contiguous conformal-coating regions.

It can be advantageous to arrange the solder-mask area to be covered by approximately half of the conformal-coating area, a minor portion of the conformal-coating area, a small portion of the conformal-coating area, or a very small portion of the conformal-coating area. It can be advantageous to arrange the solder-mask area to be approximately half of the conformal-coating area, to be approximately 40% of the conformal-coating area, to be approximately 30% of the conformal-coating area, to be approximately 25% of the conformal-coating area, to be approximately 20% of the conformal-coating area, to be approximately 15% of the conformal-coating area, to be approximately 10% of the conformal-coating area, to be approximately 7.5% of the conformal-coating area, to be approximately 5% of the conformal-coating area, or to be approximately 2.5% of the conformal-coating area, or to be approximately 1% of the conformal-coating area.

Optionally, for any circuit board disclosed herein, the at least one conformal-coating is arranged to cover a conformal-coating area (C) of at least a portion of the first surface;

wherein the at least one conformal-coating is arranged to cover a mask-free area (F) of one or more portions of the at least one mask-free region and/or at least one further mask-free region; and wherein the mask-free area (F) compared to the conformal-coating area (C) is approximately 998, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

For example, a more reliable encapsulation can be possible by arranging the at least one conformal-coating to cover at least a portion of the at least one mask-free region, such that the conformal-coating area is approximately the same as the mask-free area, substantially the same as the mask-free area. The mask-free area can comprise one or more contiguous and/or non-contiguous mask-free regions. The conformal-coating area can comprise one or more contiguous and/or non-contiguous conformal-coating regions.

It can be advantageous to arrange the mask-free area to be covered by approximately half of the conformal-coating area, a major portion of the conformal-coating area, a large portion of the conformal-coating area, or a very large portion of the conformal-coating area. It can be advantageous to arrange the mask-free area to be approximately half of the conformal-coating area, to be approximately 60% of the conformal-coating area, to be approximately 70% of the conformal-coating area, to be approximately 75% of the conformal-coating area, to be approximately 80% of the conformal-coating area, to be approximately 85% of the conformal-coating area, to be approximately 90% of the conformal-coating area, to be approximately 92.5% of the conformal-coating area, to be approximately 95% of the conformal-coating area, to be approximately 97.5% of the conformal-coating area, or to be approximately 99% of the conformal-coating area.

Optionally, for any circuit board disclosed herein, the at least one conformal-coating is arranged to cover a conformal-coating area (C) of at least a portion of the first surface; wherein the at least one conformal-coating is arranged to cover a trace-free area (T) of at least a portion of the first surface; and wherein the trace-free area (T) compared to the conformal-coating area (C) is approximately 99%, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

For example, a more reliable encapsulation can be possible by arranging the at least one conformal-coating to cover at least a portion of the at least one trace-free region, such that the trace-free area is approximately the same as the conformal-coating area, or substantially the same as the conformal-coating area. The trace-free area can comprise one or more contiguous and/or non-contiguous trace-free regions. The conformal-coating area can comprise one or more contiguous and/or non-contiguous conformal-coating regions.

It can be advantageous to arrange the trace-free area to be covered by approximately half of the conformal-coating area, a major portion of the conformal-coating area, a large portion of the conformal-coating area, or a very large portion of the conformal-coating area. It can be advantageous to arrange the trace-free area to be approximately half of the conformal-coating area, to be approximately 60% of the conformal-coating area, to be approximately 70% of the conformal-coating area, to be approximately 75% of the conformal-coating area, to be approximately 80% of the conformal-coating area, to be approximately 85% of the conformal-coating area, to be approximately 90% of the conformal-coating area, to be approximately 92.5% of the conformal-coating area, to be approximately 95% of the conformal-coating area, to be approximately 97.5% of the conformal-coating area, or to be approximately 99% of the conformal-coating area.

Optionally, for any circuit board disclosed herein, the at least one conformal-coating is arranged to cover a conformal-coating area (C) of at least a portion of the first surface; wherein the at least one conformal-coating is arranged to cover a trace- and mask-free area (TF) of at least a portion of the first surface; and wherein the trace- and mask-free area (TF) compared to the conformal-coating area (C) is approximately 99%, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

For example, a more reliable encapsulation can be possible by arranging the at least one conformal-coating to cover at least a portion of the at least one trace- and mask-free region, such that the trace and mask-free area is approximately the same as the conformal-coating area, substantially the same as the conformal-coating area. The trace- and mask-free area can comprise one or more contiguous and/or non-contiguous trace- and mask-free regions. The conformal-coating area can comprise one or more contiguous and/or non-contiguous conformal-coating regions.

It can be advantageous to arrange the trace- and mask-free area to be covered by approximately half of the conformal-coating area, a major portion of the conformal-coating area, a large portion of the conformal-coating area, or a very large portion of the conformal-coating area. It can be advantageous to arrange the trace- and mask-free area to be approximately half of the conformal-coating area, to be approximately 60% of the conformal-coating area, to be approximately 70% of the conformal-coating area, to be approximately 75% of the conformal-coating area, to be approximately 80% of the conformal-coating area, to be approximately 85% of the conformal-coating area, to be approximately 90% of the conformal-coating area, to be approximately 92.5% of the conformal-coating area, to be approximately 95% of the conformal-coating area, to be approximately 97.5% of the conformal-coating area, or to be approximately 99% of the conformal-coating area.

BRIEF DESCRIPTION OF DRAWINGS

The embodiments will now be illustrated with reference to the example section below, and with reference to the drawing wherein

FIG. 11 is an enlarged view of a second portion of the circuit board in FIG. 1, depicting a top-view of a solder-mask layout, comprised in a board surface, and suitable for use with the pad layout in FIG. 10;

DETAILED DESCRIPTION

Figure 1:
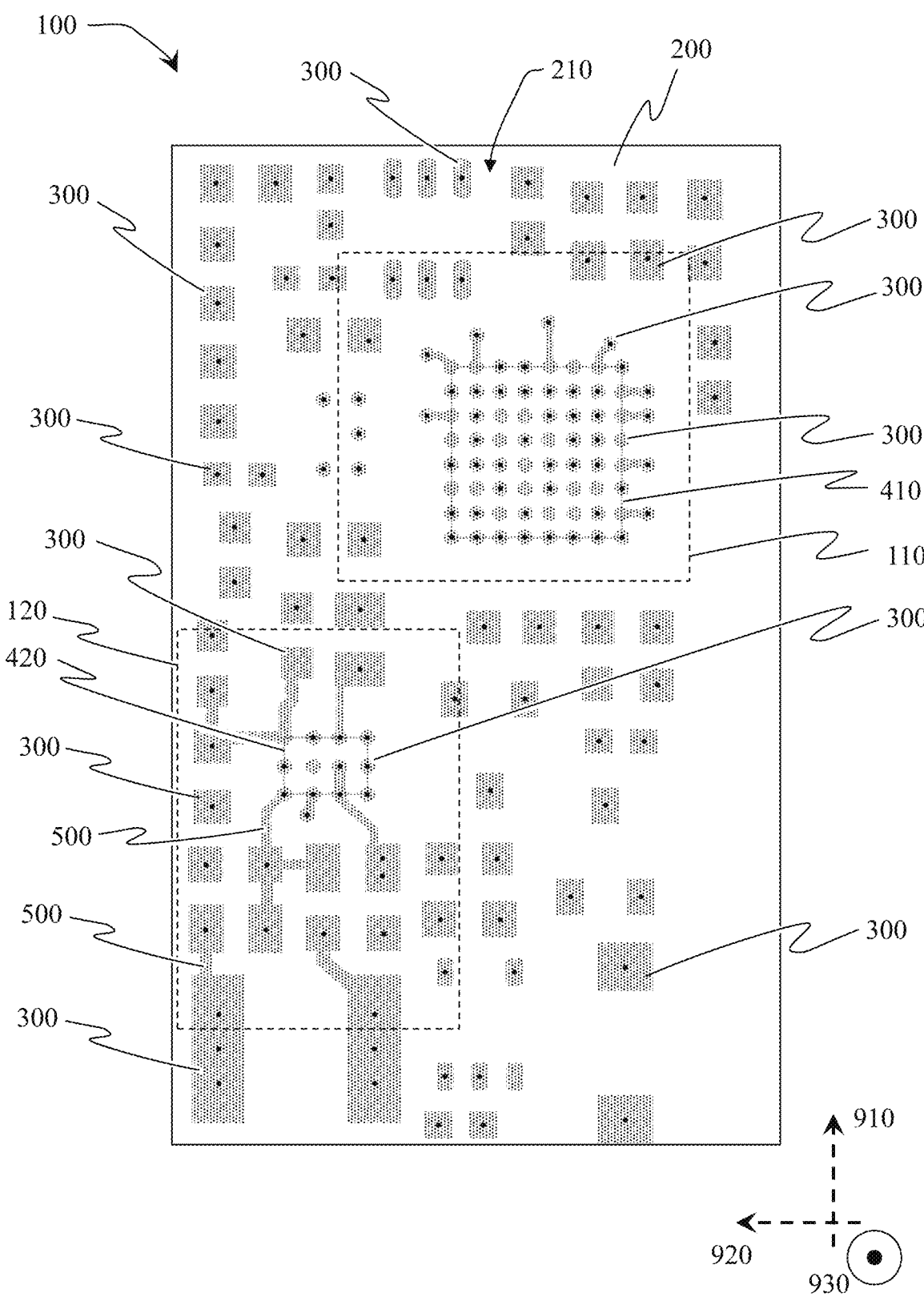
FIG. 1 is an example of a circuit board depicting a top-view of a pad layout, comprised in a board surface.

FIG. 1 shows an example of a circuit board 100 depicting a top-view of a pad layout, comprised in a board surface. In general, a circuit board is a physical platform for mounting and interconnecting one or more electrical and/or electronic components. In general, a circuit board can also be described as a printed circuit board (PCB) because conductive patterns are defined and applied to the circuit board in a controlled, typically planar manufacturing process. In general, a planar manufacturing process can involve steps such as imaging, masking, solder-masking, chemical etching, and deposition. A physical platform can also be described as a substrate. In the context of this disclosure, circuit board refers to at least one substrate made by any suitable manufacturing process that includes a use of at least one region of solder-mask.

Circuit board can also refer to more than one substrate functionally and/or physically interconnected.

In general, a substrate of a circuit board comprises one or more non-conductive materials that are suitable for supporting and insulating conductors. The choice of one or more suitable materials can depend on requirements such as a mechanical strength, a thermal performance, a glass-transition temperature, a dielectric property, a cost, or any combination thereof. For example, suitable materials can include an FR-4 (flame retardant) epoxy resin, a polyimide resin, a ceramic, a fiberglass, a composite epoxy material, an aluminum, a copper, a metal core, a PTFE (Teflon), an LCP (Liquid Crystal Polymer), or any combination thereof.

The circuit board 100 depicted in FIG. 1 comprises at least one board layer (not labelled). In general, a board layer is a physical layer comprised in a circuit board and arranged to provide one or more functions. For example, a board layer can comprise one or more conductive-traces, one or more planes, one or more dielectric materials, one or more mechanical supports, or any combination thereof. In the context of this disclosure, board layer refers to at least one physical layer made by any suitable manufacturing process. Board layer can also refer to more than one physical layer functionally and/or physically interconnected. A board layer can be wholly or partially arranged on one or more surfaces of a substrate.

The circuit board 100 comprises at least one substrate 200 with one or more surfaces, including a first surface 210.

The circuit board 100 comprises one or more pads. In general, a pad is discrete, localized area of one or more conductive materials at least partially arranged on a surface of a substrate. In general, a pad can be arranged for soldering, testing, grounding, thermal relief, heat sinking, or any combination thereof. In general, a pad can also be at least partially arranged in one or more board layers. In general, a pad can be designed to allow an electrical connection and/or a mechanical connection between a component and one or more conductive-traces. Additionally or alternatively, a pad can be arranged to provide an interface for assembly, such as being arranged to provide a degree of control during an assembly process. For example, a degree of control can be provided during manual and/or automated soldering, such as reflow soldering or wave soldering. In general, a pad can be formed as a conductive area, an exposed portion of a conductive copper trace, or any combination thereof. In general, a pad usually forms a thin layer with similar thicknesses to a conductive-trace (see below).

A thermal relief or heat sink is a type of pad, arranged to provide a degree of shielding, redirection, transfer and/or dissipation of thermal energy from power components.

A pad can be arranged as, or comprise, one or more vias or via holes. A via can be arranged to provide one or more electrical and/or mechanical connections between one or more board layers and/or board surfaces. One or more vias can be at least partially arranged as a thermal via to provide a degree of transfer and/or redirection of thermal energy between one or more board layers and/or board surfaces.

The circuit board 100 comprises at least one solder-pad 300. In general, a solder-pad is a type of pad designed to at least partially receive solder for the purpose of forming a mechanical and/or an electrical connection between a lead and/or terminal of one or more electrical components and a substrate. In general, a solder-pad is usually at least partially arranged on one or more surfaces of a substrate. In general, a solder-pad can also be at least partially arranged in one or more board layers. A solder-pad can be arranged to be at least partially uncovered by a solder-mask to control, reduce and/or prevent a degree of solder wetting. A solder-pad can be arranged as surface mount device (SMD) pad to receive one or more connections of one or more surface-mount devices. Additionally or alternatively, a solder-pad can be arranged as a ball grid array (BGA) pad to receive one or more connections of one or more ball-grid array devices. Additionally or alternatively, a solder-pad can be arranged to receive one or more lead connections of one or more electrical components. Additionally or alternatively, a solder-pad can be arranged as a through-hole pad, allowing at least a portion of a lead to pass through one or more board layers.

In FIG. 1, the at least one solder-pad 300 is indicated as at least one shape with an oblique hatching. For clarity, only a selection of solder-pads 300 are labelled. In the examples depicted, pads and solder-pads are shown with approximately circular, oval, square and/or rectangular shapes. Some of the pad and solder-pads comprise a through-hole, a via and/or a via hole which is depicted as one or more black dots within the shapes. The use of oblique hatching should not be interpreted as necessarily indicating a cross-section. The example in FIG. 1 depicts a schematic representation of a pad layout design. Depending on the process steps followed to manufacture and assemble the circuit board 100, and the portions of the circuit board 100 where the steps are performed, the depicted pad layout design can represent one or more schematic top-views, one or more final top-views, one or more intermediate top-views, one or more cross-sections, one or more cross-sections through a plane approximately equidistant from the first surface 210, or any combination thereof.

The circuit board 100 comprises at least one solder-pad 300, arranged to retain at least one electrical connection of at least one electrical component.

In the example of FIG. 1, the circuit board 100 comprises at least one solder-pad 300, comprised in the first surface 210, and arranged to retain at least one electrical connection of a first electrical component 410. For clarity, only a perimeter of the first electrical component 410 is indicated with a double dotted line, passing through an approximate center point of the outer pads arranged to receive the first electrical component 410. As depicted in FIG. 1, the circuit board 100 comprises at least one solder-pad 300, comprised in the first surface 210, and arranged to retain at least one electrical connection of a second electrical component 420. For clarity, only a perimeter of the second electrical component 420 is indicated with a double dotted line, passing through an approximate center point of the outer pads arranged to receive the second electrical component 420.

"Comprised in the first surface" means that the at least one solder-pad 300 is relatively thin compared to the substrate 200, and is at least partially attached to the first surface 210. For example, the at least one solder-pad 300 can have a thickness similar to a conductive-trace, such as in the range of approximately 17.5 μm to 70 μm (0.0175 mm to 0.070 mm). The at least one solder-pad 300 can also be at least partially embedded in the first surface 210. Optionally, one or more layers, coatings and/or films can also be comprised in the first surface 210 between the at least one solder-pad 300 and the substrate 200.

The circuit board 100 depicted in FIG. 1 comprises a first board portion 110, a second board portion 120, a third board portion (not depicted), and a fourth board portion (not depicted). Further details and enlarged views of the third and fourth board portions are described below in relation to the other figures. As depicted in FIG. 1, the first board portion 110 comprises at least one solder-pad 300, comprised in the first surface 210, and arranged to retain at least one electrical connection of the first electrical component 410. As depicted in FIG. 1, the second board portion 120 comprises at least one solder-pad 300, comprised in the first surface 210, and arranged to retain at least one electrical connection of the second electrical component 420.

The circuit board 100 depicted in FIG. 1 extends along a first axis 910 and a second axis 920, wherein the first axis 910 is perpendicular, or approximately perpendicular, to the second axis 920. As depicted, the positive direction of the first axis 910 is from bottom-to-top, and the positive direction of the second axis is from right-to-left. The first axis 910 can be described as a longitudinal axis, and the second axis 920 can be described as a first-transverse axis. As depicted, extents along the first axis 910 can be described as a height, and extents along the second axis 920 can be described as widths. Optionally, the circuit board 100 can be arranged such that the second axis 920 can be described as a longitudinal axis, and the first axis 910 can be described as a first-transverse axis.

The circuit board 100 depicted in FIG. 1 extends along a third axis 930, wherein the third axis 930 is perpendicular, or approximately perpendicular, to the first axis 910, and perpendicular, or approximately perpendicular, to the second axis 920. As depicted, the positive direction of the third axis 930 is out of the page. As depicted, the third axis 930 can be described as a second-transverse axis, and extents along the third axis 930 can be described as a height.

Figure 2:
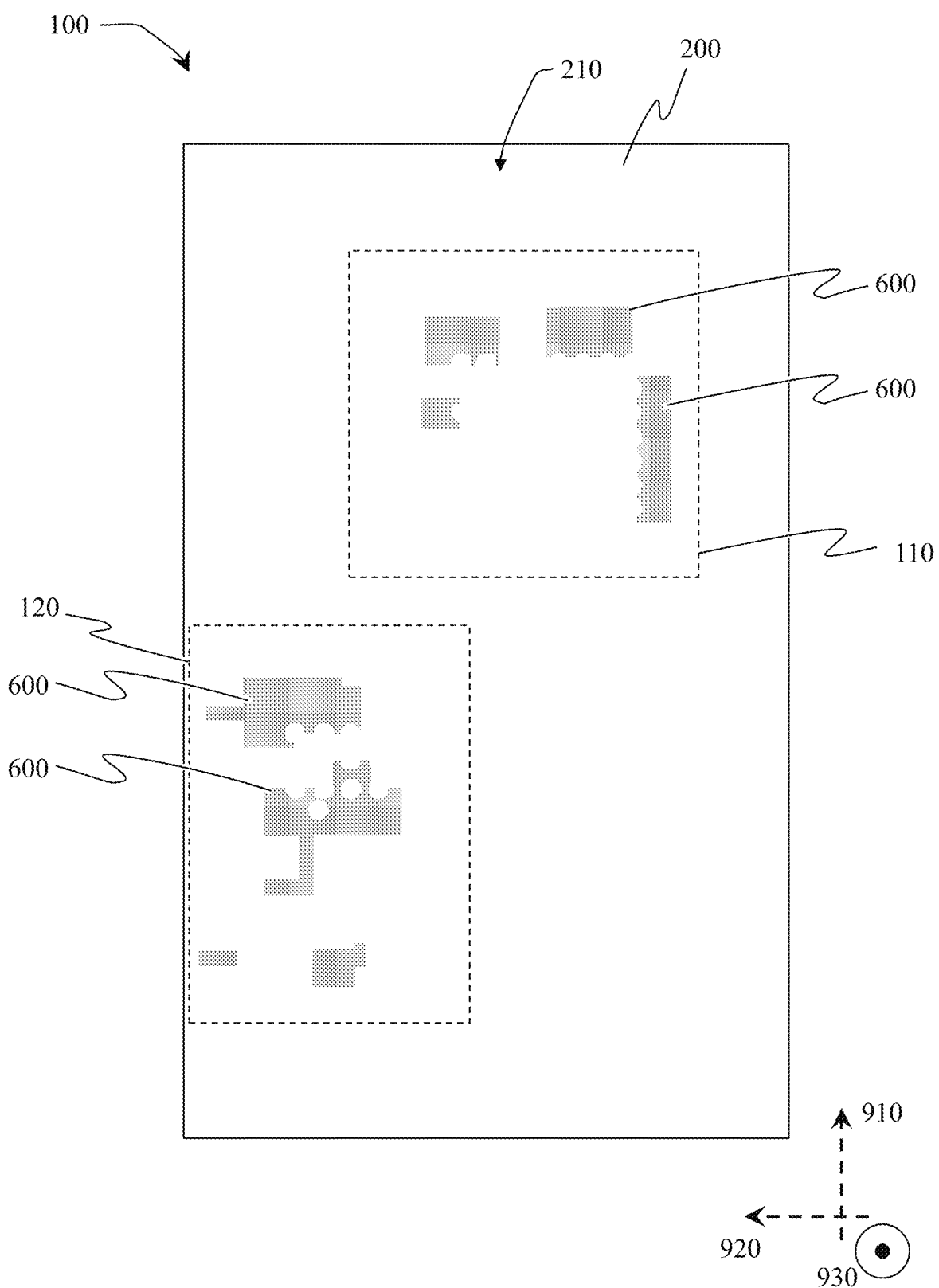
FIG. 2 is an example of a circuit board depicting a top-view of a solder-mask layout, comprised in a board surface, and suitable for use with the pad layout in FIG. 1.

FIG. 2 shows an example of a circuit board depicting a top-view of a solder-mask layout, comprised in a board surface. In this example, the solder-mask layout depicted in FIG. 2 is arranged to be suitable for use with the pad layout depicted in FIG. 1.

The circuit board 100 depicted in FIG. 2 comprises at least one region of a solder-mask 600, comprised in the first surface 210. In general, a solder-mask is one or more protective layers arranged to control, reduce and/or prevent a degree of solder wetting during assembly. For example, one or more regions of one or more solder-masks can be arranged to reduce a risk of a short circuit, a solder bridge, a solder migration, or any combination thereof. Additionally or alternatively, one or more regions of a solder-mask can be arranged to reduce a risk of contamination and/or corrosion. In general, a solder-mask is usually green colored. In general, a solder-mask forms a thin layer, with a thickness that depends on the type of solder-mask, how it is applied, and the required properties. Suitable materials include a Liquid Photoimageable (LPI), a dry-film solder-mask, an inkjet solder-mask, or any combination thereof. For example, a solder-mask can be applied as a liquid, then exposed and developed like a photoresist, followed by a curing. In the context of this disclosure, solder-mask refers to one or more suitable materials which can at least partially coat at least a portion of one or more surfaces of at least one solder-pad and/or at least one conductive-trace.

"Comprised in the first surface" means that the at least one region of a solder-mask 600 is relatively thin compared to the substrate 200, and is at least partially attached to the first surface 210. The at least one region of a solder-mask 600 can also be at least partially embedded in the first surface 210. Optionally, one or more layers, coatings and/or films can also be comprised in the first surface 210 between the at least one region of a solder-mask 600 and the substrate 200.

In general, a thickness of a solder-mask can vary depending on circuit board features—for example, a degree of surface leveling can cause a thickness to be less over a pad and/or a conductive-trace, and more in an adjacent region without a pad and/or a conductive-trace. For example, a Liquid Photoimageable (LPI) layer can be approximately in the range of 8 to 20 μm (0.008 to 0.020 mm) over a pad and/or conductive-trace, and approximately in the range of 15 to 25 μm (0.015 to 0.025 mm) over an adjacent region without a pad and/or a conductive-trace. For example, a dry-film solder-mask layer can be approximately in the range of 30 to 50 μm (0.030 to 0.050 mm) over a pad and/or a conductive-trace, and approximately in the range of 30 to 50 μm (0.030 to 0.050 mm) over an adjacent region without a pad or a conductive-trace. For example, an inkjet solder-mask layer can be approximately in the range of 10 to 30 μm (0.010 to 0.030 mm) over a pad and/or a conductive-trace, and approximately in the range of 10 to 30 μm (0.010 to 0.030 mm) over an adjacent region without a pad or a conductive-trace.

In FIG. 2, the at least one region of a solder-mask 600 is indicated as at least one region with a light-grey shading. For clarity, only a selection of regions of solder-mask 600 are labelled. In the examples depicted, regions of solder-mask are depicted as grey shapes, with complex shapes, including rectangular protrusions, openings and/or partial openings. The example in FIG. 2 depicts a schematic representation of a solder-mask layout suitable for use with the pad layout in FIG. 1. Depending on the process steps followed to manufacture and assemble the circuit board 100, and the portions of the circuit board 100 where the steps are performed, the depicted solder-mask layout design can represent one or more schematic top-views, one or more final top-views, one or more intermediate top-views, one or more cross-sections, one or more cross-sections through a plane approximately equidistant from the first surface 210, or any combination thereof.

The first board portion 110 comprises at least one region of a solder-mask 600. The second board portion 120 comprises at least one region of a solder-mask 600. Similar to FIG. 1, the third board portion and the fourth board portion are not depicted here, but are described below in relation to the other figures.

Figure 3:
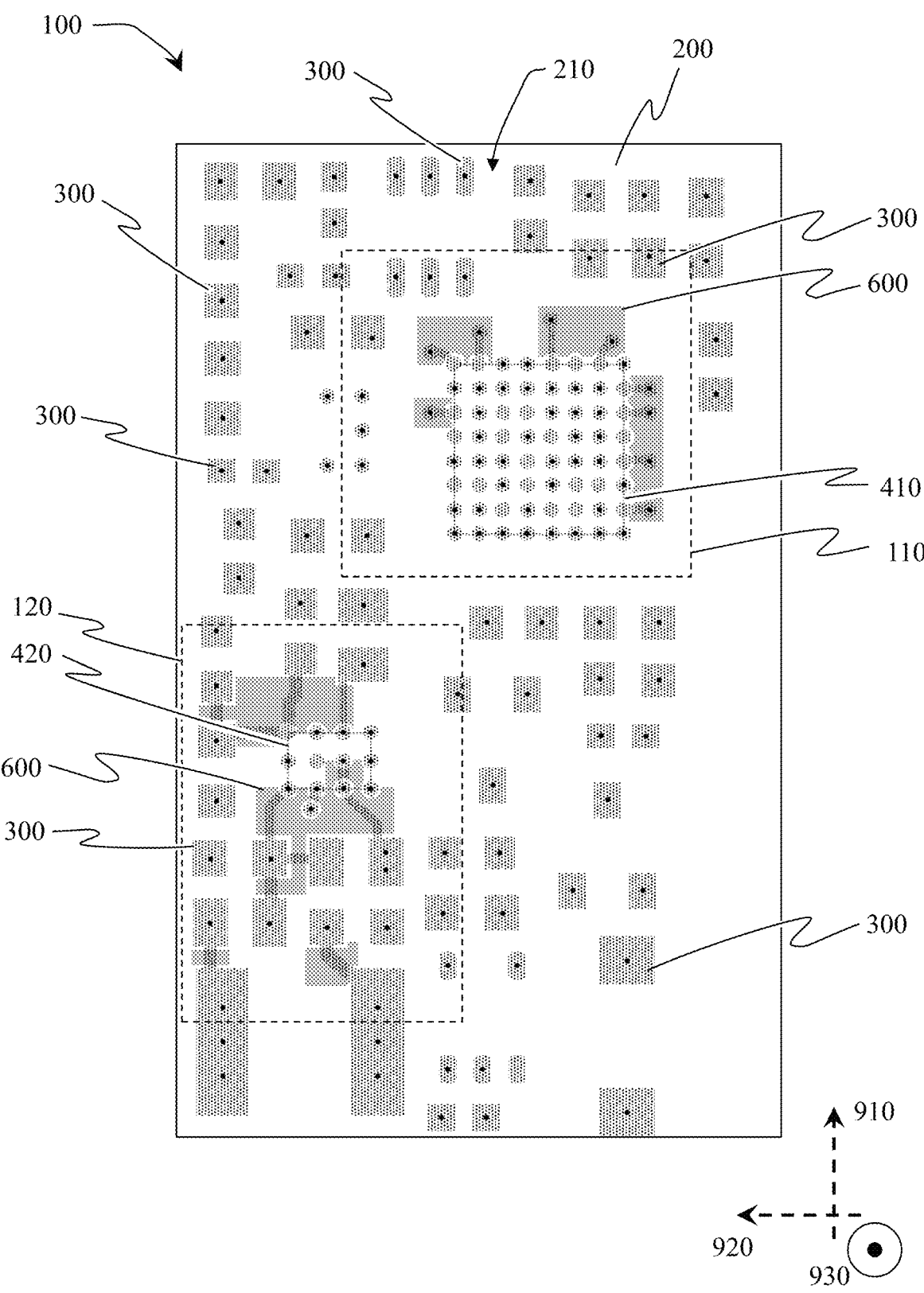
FIG. 3 is an example of a circuit board depicting a top-view of a combination of the pad layout in FIG. 1 and the solder-mask layout in FIG. 2, comprised in a board surface.

FIG. 3 shows an example of a circuit board depicting a top-view of a pad layout and a solder-mask layout, comprised in a board surface. In this example, the solder-mask layout depicted in FIG. 2 is combined with the pad layout depicted in FIG. 1.

The circuit board 100 depicted in FIG. 3 comprises at least one solder-pad 300 and at least one region of a solder-mask 600, comprised in the first surface 210.

"Comprised in the first surface" means that the at least one solder-pad 300 and the at least one region of a solder-mask 600 are relatively thin compared to the substrate 200, and are at least partially attached to the first surface 210. The at least one solder-pad 300 and at least one region of a solder-mask 600 can also be at least partially embedded in the first surface 210. Optionally, one or more layers, coatings and/or films can also be comprised in the first surface 210 between the substrate 200 and the at least one solder-pad 300 and/or the at least one region of a solder-mask 600. For clarity, only a selection of only a selection of solder-pads 300 and a selection of regions of solder-mask 600 are labelled.

The first board portion 110 comprises at least one solder-pad 300 and at least one region of a solder-mask 600. The second board portion 120 comprises at least one solder-pad 300 and at least one region of a solder-mask 600. Similar to FIG. 1 and FIG. 2, the third board portion and the fourth board portion are not depicted, but described below in relation to the other figures.

In the example of FIG. 3, the first board portion 110 comprises at least one solder-pad 300, comprised in the first surface 210, and arranged to retain at least one electrical connection of the first electrical component 410. As depicted in FIG. 3, the second board portion 120 comprises at least one solder-pad 300, comprised in the first surface 210, and arranged to retain at least one electrical connection of the second electrical component 420.

Figure 4:
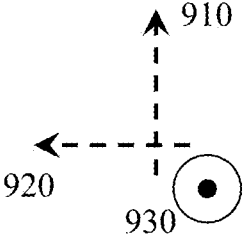
FIG. 4 is an enlarged view of a first portion of the circuit board in FIG. 1, depicting a top-view of a pad layout, comprised in a board surface.

FIG. 4 shows an enlarged view of a portion of a circuit board, depicting a top-view of a pad layout, comprised in a board surface. In the example depicted in FIG. 4, an enlarged view is depicted of the first board portion 110 of the circuit board in FIG. 1, comprised in the first surface 210. The first board portion 110 comprises at least one solder-pad 300. For clarity, only a selection of solder-pads 300 are labelled. The first board portion 110 comprises at least one solder-pad 300, arranged to retain at least one electrical connection of at least one electrical component.

The first board portion 110 comprises at least one conductive-trace 500. In the context of this disclosure, a conductive-trace is an electrical pathway that couples, connects and/or interconnects one or more pads and/or solder-pads comprised in a circuit board. For clarity, only a selection of conductive-traces 500 are labelled. The at least one conductive-trace 500 is indicated as at least one shape with an oblique hatching. In the examples depicted, conductive-traces are shown with approximately rectangular shapes, with optional bends, between the pads and/or solder-pads. A conductive-trace can be at least partially arranged on and/or in a surface of a circuit board and/or a board layer. A conductive-trace can comprise any suitable conductive material, such as copper, silver, gold, tin, nickel, carbon, or any combination thereof. Similar to a pad and a solder-pad, a conductive-trace usually forms a relatively thin layer, and is typically specified in ounces per square foot (oz/ft$^2$) or grams per square meter (g/m$^2$). Thinner or thicker layers can be used depending on space, current, and thermal requirements. For example, if a high-purity copper is used with a copper weight of 1 oz/ft$^2$, the layer thickness is approximately 35 μm (0.035 mm) or 1.4 mils. Similarly, if a copper weight of 0.5 oz/ft$^2$, the layer thickness is approximately 17.5 μm (0.0175 mm) or 0.7 mils. Similarly, if a copper weight of 2 oz/ft$^2$, the layer thickness is approximately 70 μm (0.070 mm) or 2.8 mils.

In the example of FIG. 4, the first board portion 110 comprises at least one solder-pad 300, comprised in the first surface 210, and arranged to retain at least one electrical connection of the first electrical component 410. As depicted, the first board portion 110 comprises at least one conductive-trace 500, comprised in the first surface 210.

"Comprised in the first surface" means that the at least one conductive-trace 500 is relatively thin compared to the substrate, and are at least partially attached to the first surface 210. The at least one conductive-trace 500 can also be at least partially embedded in the first surface 210. Optionally, one or more layers, coatings and/or films can also be comprised in the first surface 210 between the substrate 200 and the at least one conductive-trace 500.

FIG. 4 depicts the third board portion 130. In the example depicted in FIG. 4, the third board portion 130 is comprised in the first board portion 110. Further details and enlarged views of the third board portion 130 are described below in relation to the other figures.

Figure 5:
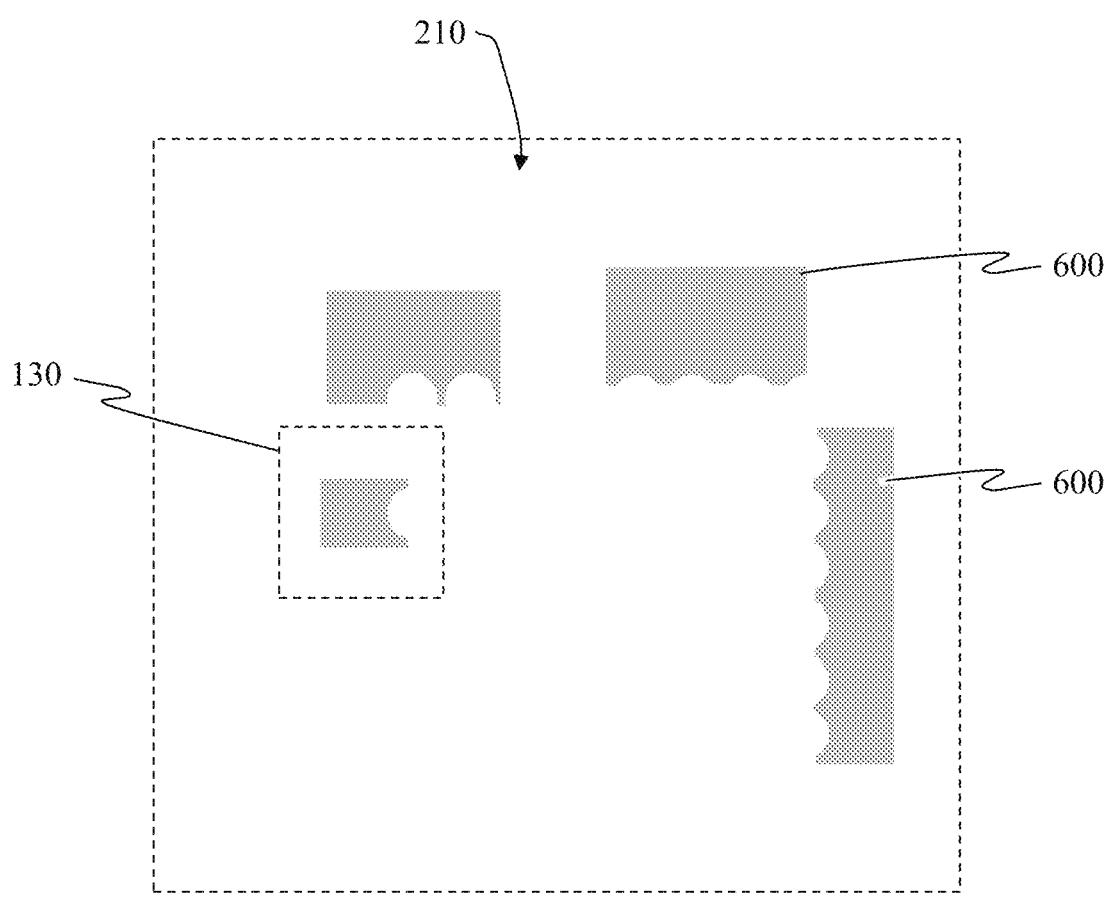
FIG. 5 is an enlarged view of a first portion of the circuit board in FIG. 1, depicting a top-view of a solder-mask layout, comprised in a board surface, and suitable for use with the pad layout in FIG. 4.

FIG. 5 shows an enlarged view of a portion of a circuit board, depicting a top-view of a solder-mask layout, comprised in a board surface. In the example depicted in FIG. 5, an enlarged view is depicted of the first board portion 110 of the circuit board in FIG. 1, comprised in the first surface 210. FIG. 5 depicts an enlarged view of the first board portion 110, which is comprised in the circuit board of FIG. 2.

The first board portion 110 comprises at least one region of a solder-mask 600, comprised in the first surface 210. For clarity, only a selection of regions of solder-mask 600 are labelled. FIG. 5 depicts the third board portion 130.

Figure 6:
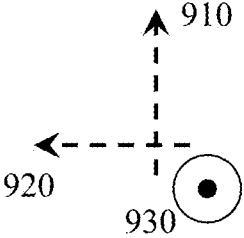
FIG. 6 is an enlarged view of a first portion of the circuit board in FIG. 1, depicting a combination of the pad layout in FIG. 4 and the solder-mask layout in FIG. 5, comprised in a board surface.

FIG. 6 shows an enlarged view of a portion of a circuit board, depicting a top-view of a pad layout and a solder-mask layout, comprised in a board surface. In the example depicted in FIG. 6, an enlarged view is depicted of the first board portion 110 of the circuit board in FIG. 1, comprised in the first surface 210. FIG. 6 depicts an enlarged view of the first board portion 110, which is comprised in the circuit board of FIG. 3. In this example, the solder-mask layout depicted in FIG. 5 is combined with the pad layout depicted in FIG. 4.

The first board portion 110 comprises at least one solder-pad 300 and at least one region of a solder-mask 600, comprised in the first surface 210. For clarity, only a selection of solder-pads 300 and a selection of regions of solder-mask 600 are labelled.

In the example of FIG. 6, the first board portion 110 comprises at least one solder-pad 300, comprised in the first surface 210, and arranged to retain at least one electrical connection of the first electrical component 410. FIG. 6 depicts the third board portion 130.

Figure 7:
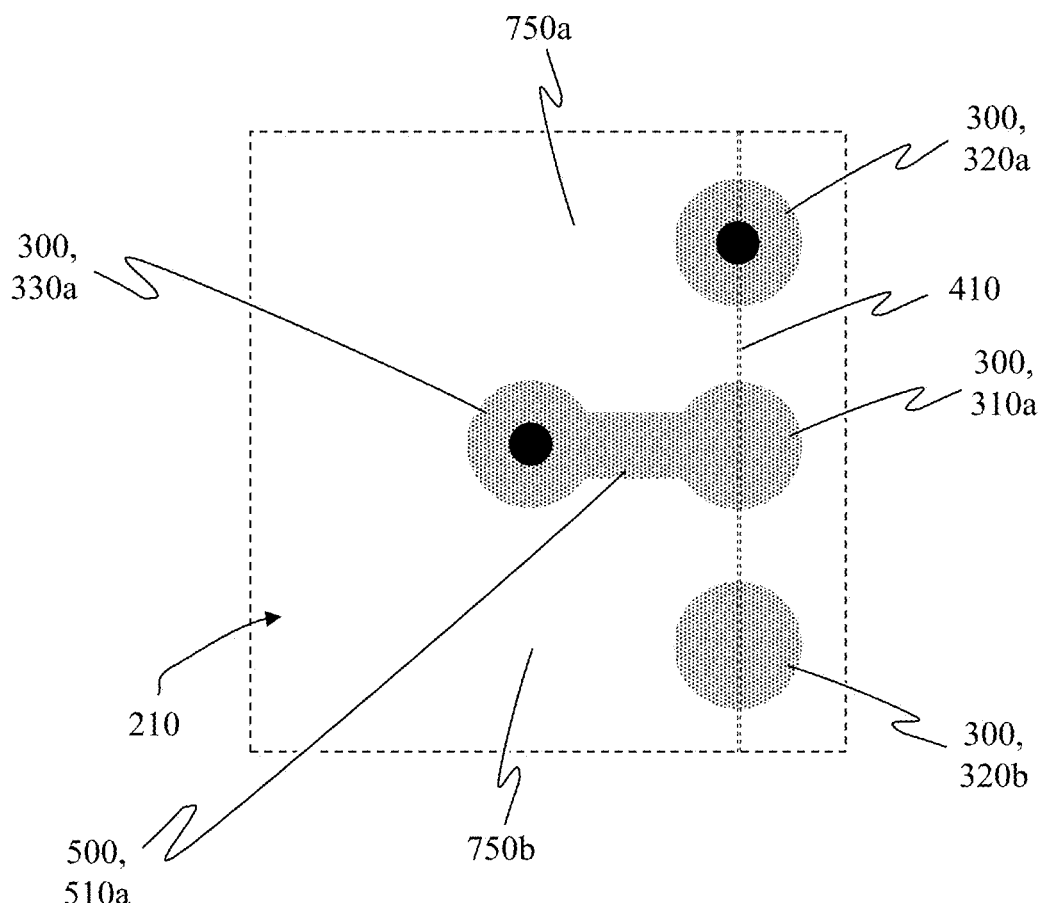
FIG. 7 is an enlarged view of a third portion of the circuit board in FIG. 1, and an enlarged view of a portion of the circuit board in FIG. 4, depicting a top-view of a pad layout, comprised in a board surface.

FIG. 7 shows an enlarged view of a portion of a circuit board, depicting a top-view of a pad layout, comprised in a board surface. In the example depicted in FIG. 7, an enlarged view is depicted of the third board portion 130 of the circuit board in FIG. 1, comprised in the first surface 210. The example depicted in FIG. 7 is an enlarged view of the third board portion 130, which is comprised in the first board portion of FIG. 4.

The third board portion 130 comprises at least one solder-pad 300. The third board portion 130 comprises at least one solder-pad 300, arranged to retain at least one electrical connection of at least one electrical component. In the example depicted in FIG. 7, the third board portion 130 comprises at least one solder-pad 300, comprised in the first surface 210, arranged to retain at least one electrical connection of the first electrical component 410. The third board portion 130 comprises at least one example of a first solder-pad 310, connected to at least one adjacent conductive-trace, and arranged to retain at least one electrical connection of an electrical component.

In the context of this disclosure, adjacent means a separation that is sufficiently small to allow coverage by the same conformal-coating-region (not depicted).

The third board portion 130 comprises at least one example of a second solder-pad 320, arranged to retain at least one electrical connection of an electrical component. The first solder-pad 310 and the second solder-pad 320 each are arranged to retain at least one electrical connection of the same electrical component. Optionally, a first solder-pad 310 can also be arranged for testing, grounding, thermal relief, heat sinking, or any combination thereof. Additionally or alternatively, a first solder-pad 310 can be at least partially arranged as, or comprise, one or more vias or via holes. Optionally, a second solder-pad 320 can also be arranged for testing, grounding, thermal relief, heat sinking, or any combination thereof. Additionally or alternatively, a second solder-pad 320 can be at least partially arranged as, or comprise, one or more vias or via holes. In the example depicted in FIG. 7 and FIG. 9, the second solder-pad 320 is depicted with a black dot because it is optionally arranged as a one or more vias.

The third board portion 130 comprises at least one example of a third pad 330, connected to at least one example of a conductive-trace 500. Optionally, a third pad 330 can be arranged as a solder-pad for soldering, testing, grounding, thermal relief, heat sinking, or any combination thereof. Additionally or alternatively, a third pad 330 can be at least partially arranged as, or comprise, one or more vias or via holes. Additionally or alternatively, a third pad 330 can be arranged to retain at least one electrical connection of an electrical component. Optionally, a third pad 330 can also be arranged for testing, grounding, thermal relief, heat sinking, or any combination thereof. Additionally or alternatively, a third pad 330 can be at least partially arranged as, or comprise, one or more vias or via holes. In the example depicted in FIG. 7 and FIG. 9, the third pad 330 is depicted with a black dot because it is optionally arranged as a one or more vias.

In the example depicted in FIG. 7, the first surface 210 comprises a first example of a first solder-pad 310a and a first example of a second solder-pad 320a. The first example of a first solder-pad 310a and the first example of a second solder-pad 320a each are arranged to retain at least one electrical connection of the first electrical component 410. As depicted in FIG. 7, the first example of a second solder-pad 320a is depicted above the first example of a first solder-pad 310a. In the example depicted in FIG. 7, the first example of a second solder-pad 320a can be optionally arranged to be adjacent to a first example of a trace-free region 750a. In the context of this disclosure, trace-free means that the region is arranged to be free, or substantially free, of traces, conductive-traces, pads, vias, and solder-pads.

A trace-free region is a defined portion of the first surface 210 in which an outer surface of the substrate 200 does not comprise a trace or a conductive-trace, such that the underlying surface remains exposed and is available for a direct interaction with a solder, a surface treatment, a protective coating and/or a conformal-coating. A region can be considered trace-free if one or more traces and/or conductive traces are detectable, but the dimensions, extents and/or layer thicknesses are too small to provide a functional use of a trace, such as carrying a desired current without undesired overheating, providing a desired impedance and/or providing a desired signal performance. For example, a smallest practical trace dimension for a desired signal performance can be approximately 100 μm (0.1 mm), 75 μm (0.075 mm), or 50 μm (0.05 mm), or 25 μm (0.05 mm). Additionally or alternatively, a region can be considered trace-free if the at least one conformal-coating (not depicted) is arranged to cover a conformal-coating area (C) of at least a portion of the first surface 210; wherein the at least one conformal-coating (not depicted) is arranged to cover a trace-free area (T) of at least a portion of the first surface (210); and wherein the trace-free area (T) compared to the conformal-coating area (C) (ratio T:C) is greater than 99%, or greater than 99.25%, or greater than 99.5%, or greater than 99.9%. Optionally, a trace-free region can include one or more non-functional features, such as a text character and/or a graphic. For example, a trace-free region can be arranged by adapting a design and/or a process to prevent conductive material from being applied in at least a portion of the trace-free region, by at least partially rerouting one or more conductors using one or more board layers, by applying an at least partially removable conductive material and at least partially removing it, by at least partially removing at least a portion of conductive material, by at least partially removing conductive material before a soldering step, by at least partially removing conductive material after a soldering step, by at least partially removing conductive material before a reflow step, by at least partially removing conductive material after a reflow step, or any combination thereof. Optionally, at least one mask-free region and/or at least one solder-mask region can be arranged to be at least partially trace-free or trace-free.

In the example depicted in FIG. 7, the first example of a second solder-pad 320*a* can be optionally arranged to be adjacent, or immediately adjacent, to the first example of a first solder-pad 310*a*.

In the context of this disclosure, immediately adjacent solder-pads are connected to neighboring electrical connections of the same electrical component, and have a separation that is sufficiently small to allow coverage by the same conformal-coating-region (not depicted).

In the example depicted in FIG. 7, the first surface 210 comprises a second example of a second solder-pad 320*b*. The first example of a first solder-pad 310*a* and the second example of a second solder-pad 320*b* each are arranged to retain at least one electrical connection of the first electrical component 410. In FIG. 7, the second example of a second solder-pad 320*b* is depicted below the first example of a first solder-pad 310*a*. As depicted, the second example of a second solder-pad 320*b* can be optionally arranged to be adjacent, or immediately adjacent, to the first example of a first solder-pad 310*a*. In the example depicted, the second example of a second solder-pad 320*b* can be optionally arranged to be adjacent to a second example of a trace-free region 750*b*. In FIG. 7, the first example of a trace-free region 750*a* is depicted above the second example of a trace-free region 750*b*.

In the example depicted in FIG. 7, the first surface 210 comprises a first example of a third pad 330*a* and a first example of a first conductive-trace 510*a*. The first example of a first conductive-trace 510*a* is arranged to extend between the first example of a first solder-pad 310*a* and the first example of a third pad 330*a*. Optionally, the first example of a first solder-pad 310*a* can be arranged to be adjacent to the first example of a third pad 330*a*. The first example of a first conductive-trace 510*a* is arranged to couple, connect and/or interconnect the first example of a first solder-pad 310*a* with the first example of a third pad 330*a*.

Figure 8:
FIG. 8 is an enlarged view of a third portion of the circuit board in FIG. 1, and an enlarged view of a portion of the circuit board in FIG. 5, depicting a top-view of a solder-mask, comprised in a board surface, and suitable for use with the pad layout in FIG. 7.
Figure 8:
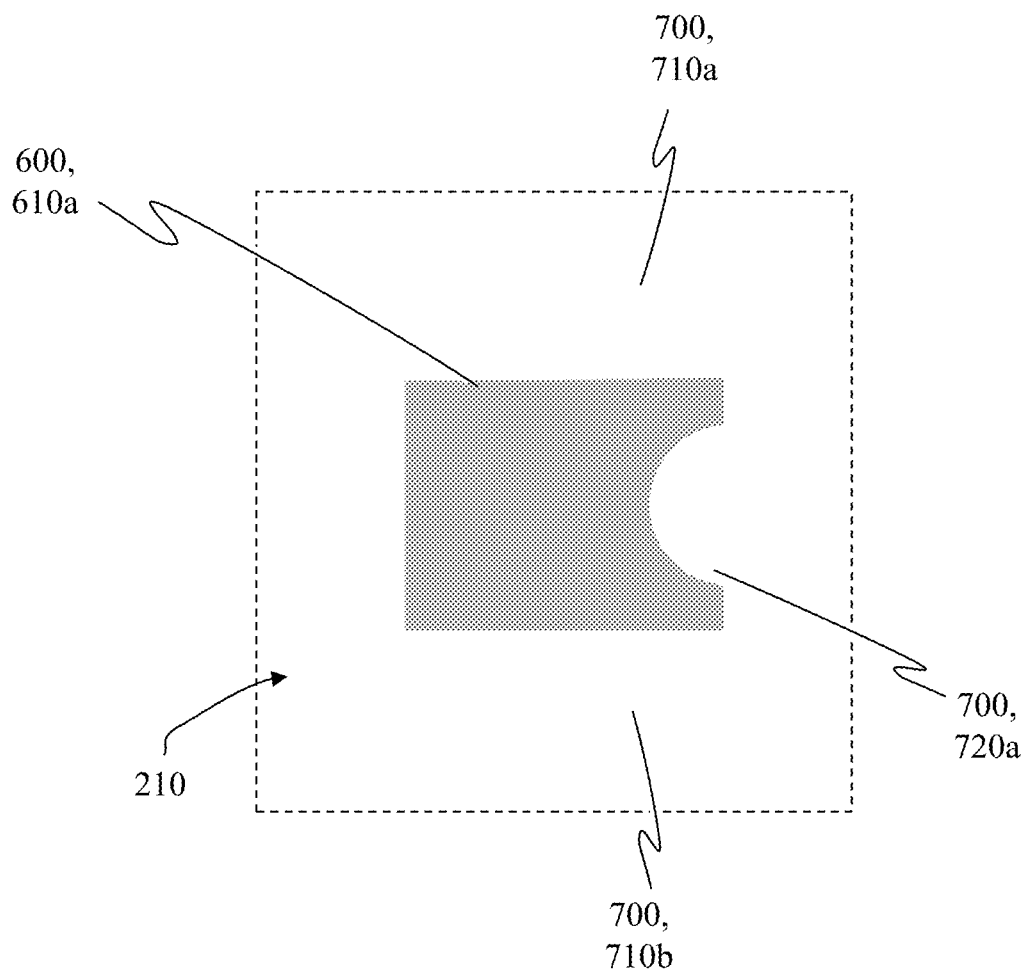
Figure 8:
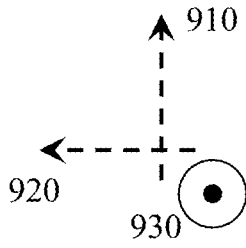

FIG. 8 shows an enlarged view of a portion of a circuit board, depicting a top-view of a solder-mask layout, comprised in a board surface. In the example depicted in FIG. 8, an enlarged view is depicted of the third board portion 130 of the circuit board in FIG. 1, comprised in the first surface 210. The example depicted in FIG. 8 is an enlarged view of the third board portion 130, which is comprised in the first board portion of FIG. 5.

The first board portion 110 comprises at least one region of a solder-mask 600. For clarity, only a selection of regions of solder-mask 600 are labelled. The first board portion 110 comprises at least one mask-free region, arranged to be free, or substantially free, of solder-mask 600.

A mask-free region, or solder-mask-free region, is a defined portion of the first surface 210 in which an outer surface of the substrate 200 is not covered by a solder-mask layer, such that the underlying surface remains exposed and is available for a direct interaction with a solder, a coating, a protective coating and/or a conformal-coating. A region can be considered mask-free if one or more solder-mask regions are detectable, but the dimensions, extents and/or layer thicknesses are too small to provide a functional use of solder-mask, such as a control, reduction and/or a prevention of a degree of solder wetting, coating adhesion, and/or a surface interaction. For example, a smallest practical solder-mask dimension for controlling solder wetting can be approximately 100 μm (0.1 mm), 75 μm (0.075 mm), or 50 μm (0.05 mm). Additionally or alternatively, a region can be considered mask-free if the at least one conformal-coating (not depicted) is arranged to cover a conformal-coating area (C) of at least a portion of the first surface 210; wherein the at least one conformal-coating (not depicted) is arranged to cover a solder-mask area (M) of one or more portions of the at least one solder-mask region 600, 610; and wherein the solder-mask area (M) compared to the conformal-coating area (C) (ratio M:C) is less than 1%, or less than 0.75%, or less than 0.5%, or less than 0.18. Optionally, a mask-free region can include one or more exposed conductive features, such as a pad, a via, a trace, or any combination thereof. Optionally, a mask-free region can include one or more non-functional features, such as a text character and/or a graphic. Additionally or alternatively, a mask-free region can optionally include one or more exposed non-conductive portions of the substrate that are intentionally left uncovered during one or more solder-mask patterning steps. For example, a mask-free region can be arranged by adapting a design and/or a process to prevent solder-mask 600 from being applied in at least a portion of the mask-free region, by applying an at least partially removable solder-mask and at least partially removing it, by at least partially removing at least a portion of solder-mask 600, by at least partially removing solder-mask 600 before a soldering step, by at least partially removing solder-mask 600 after a soldering step, by at least partially removing solder-mask 600 before a reflow step, by at least partially removing solder-mask 600 after a reflow step, or any combination thereof.

In the example depicted in FIG. 8, the first surface 210 comprises a first example of a first solder-mask region 610*a*, arranged to cover at least a portion of the first example of a first conductive-trace depicted in FIG. 7. As depicted, the first surface 210 comprises a first example of a first mask-free region 710*a* and a second example of a first mask-free region 710*b*, arranged to be free, or substantially free, of solder-mask 600. In FIG. 8, the first example of a first mask-free region 710*a* is depicted above the second example of a first mask-free region 710*b*. As depicted in FIG. 8, the first surface 210 optionally can comprise a first example of a second mask-free region 720*a*, proximate the first example of a first solder-mask region 610*a*. As depicted, the first example of the second mask-free region 720*a* is optionally arranged as a partial opening in the first example of a first solder-mask region 610*a* to control, reduce and/or prevent of a degree of solder wetting from a first solder-pad (not depicted) to a third solder-pad (not depicted).

Figure 9:
FIG. 9 is an enlarged view of a third portion of the circuit board in FIG. 1, and an enlarged view of a portion of the circuit board in FIG. 6, depicting a combination of the pad layout in FIG. 7 and the solder-mask layout in FIG. 8, comprised in a board surface.
Figure 9:
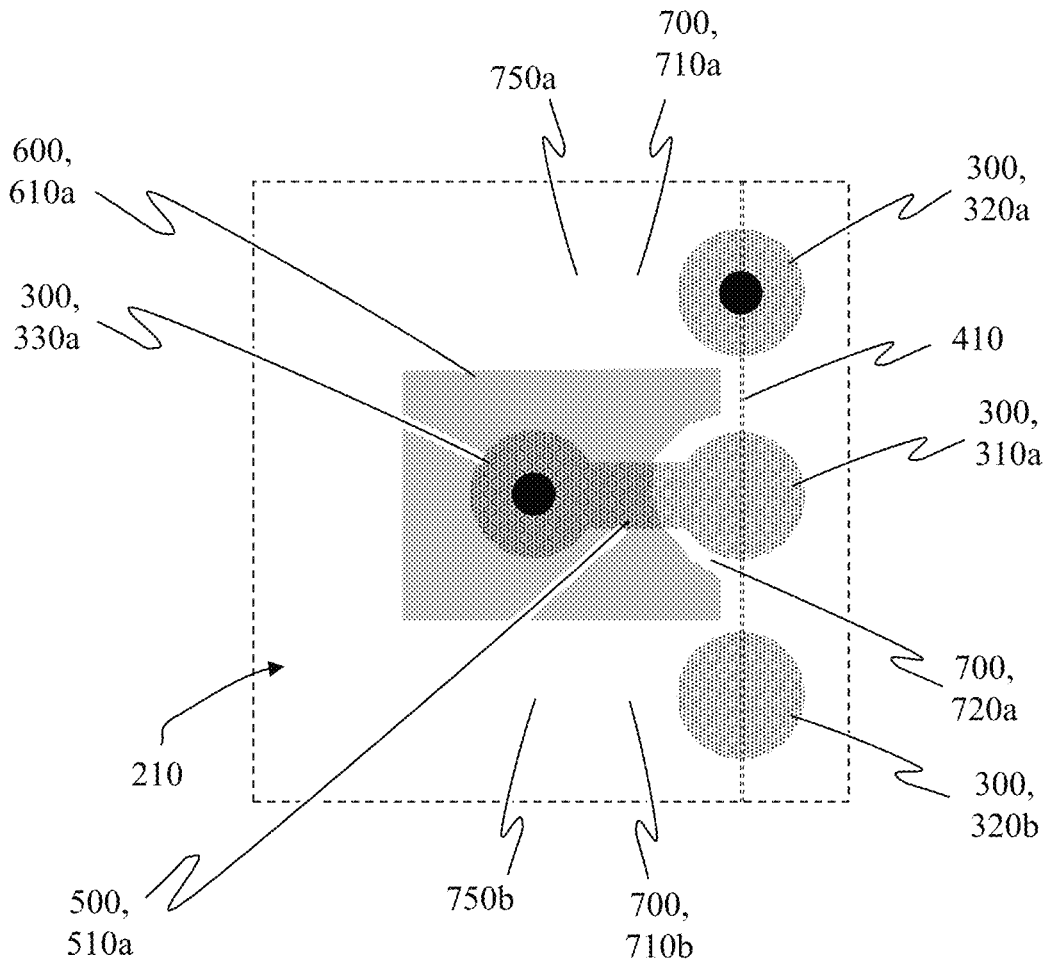
Figure 9:
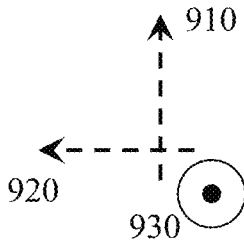

FIG. 9 shows an enlarged view of a portion of a circuit board, depicting a top-view of a pad layout and a solder-mask layout, comprised in a board surface. In the example depicted in FIG. 9, an enlarged view is depicted of the third board portion 130 of the circuit board in FIG. 1, comprised in the first surface 210. As depicted, FIG. 9 is an enlarged view of the third board portion 130, which is comprised in the first board portion of FIG. 6. In this example, the solder-mask layout depicted in FIG. 8 is combined with the pad layout depicted in FIG. 7.

The third board portion 130 comprises at least one solder-pad and at least one region of a solder-mask, comprised in the first surface 210. As depicted in FIG. 9, the third board portion 130 comprises at least one solder-pad 300, comprised in the first surface 210, arranged to retain at least one electrical connection of the first electrical component 410. As depicted, the first surface 210 comprises the first example of a first solder-pad 310a and the first example of a second solder-pad 320a depicted in FIG. 7. In FIG. 9, the first example of a second solder-pad 320 is depicted above the first example of a first solder-pad 310a. The first example of a first solder-pad 310a and the first example of a second solder-pad 320a are each arranged to retain at least one electrical connection of the same first electrical component 410. As depicted, the first surface 210 comprises the first example of a third pad 330a and the first example of a first conductive-trace 510a depicted in FIG. 7. The first example of a first conductive-trace 510a is arranged to extend between the first example of a first solder-pad 310a and the first example of a third pad 330a. Optionally, the first example of a first solder-pad 310a can be arranged to be adjacent to the first example of a third pad 330a. In the example depicted in FIG. 9, the first surface 210 comprises the first example of a first solder-mask region 610a depicted in FIG. 8, arranged to cover at least a portion of the first example of a first conductive-trace 510a. As depicted in FIG. 9, the first surface 210 comprises the first example of a first mask-free region 710a depicted in FIG. 8. In FIG. 9, the first example of a first mask-free region 710a is depicted above the first example of a first solder-mask region 610a. The first example of a first mask-free region 710a is arranged to be adjacent to the first example of a second solder-pad 320a and arranged to be free, or substantially free, of solder-mask 600.

At least a portion of the first surface 210 is arranged to be covered by at least one conformal-coating (not depicted), such that at least a portion of the first example of a first mask-free region 710a and at least a portion of the first example of a first solder-mask region 610a can be covered by the at least one conformal-coating (not depicted), whereby the at least one conformal-coating (not depicted) is in contact with the first surface 210 in at least a portion of the first example of a first mask-free region 710a, and the at least one conformal-coating (not depicted) is in contact with at least a portion of solder-mask 600 in the first example of a first solder-mask region 610a. Optionally, the at least one conformal-coating (not depicted) can be arranged to cover at least a portion of the first example of a second solder-pad 320a, such that the at least one conformal-coating (not depicted) is in contact with at least a portion of the first example of a second solder-pad 320a.

In FIG. 9, the first example of a first mask-free region 710a is depicted above the first example of a first solder-pad 310a. In FIG. 9, the first example of a trace-free region 750a is depicted above the first example of a first solder-pad 310a. Optionally, as depicted in FIG. 9, the first example of a second solder-pad 320a can be arranged to be adjacent to the first example of a trace-free region 750a as depicted in FIG. 7, whereby the first example of a first mask-free region 710a can be comprised in the first example of a trace-free region 750a. The first example of a first mask-free region 710a can optionally be arranged to be free, or substantially free, of traces and conductive-traces.

Optionally, the at least one conformal-coating (not depicted) can be arranged to cover at least a portion of the first example of a first solder-pad 310a, such that the at least one conformal-coating (not depicted) is in contact with at least a portion of the first example of a first solder-pad 310a.

Optionally, the at least one conformal-coating (not depicted) can be arranged to cover at least a portion of the first example of a third pad 330a, such that the at least one conformal-coating (not depicted) is in contact with at least a portion of the first example of a third pad 330a.

In the example depicted in FIG. 9, the first example of a first solder-mask region 610a is arranged to control, reduce and/or prevent of a degree of solder wetting during assembly away from the first example of a first solder-pad 310a, along the first example of a first conductive-trace 510a, towards the first example of a third pad 330a. The degree of wetting control is related to one or more properties of the first example of a first solder-mask region 610a, including a degree of coverage of the first example of a first conductive-trace 510a. Optionally, the first example of a first solder-mask region 610a can be arranged to cover at least a portion of the first example of a third pad 330a. Optionally, as depicted in FIG. 9, the first example of a first solder-mask region 610a can be arranged to cover all, or substantially all, or approximately all, of the first example of a third pad 330a.

Similarly, the example of FIG. 9 depicts the second example of a second solder-pad 320b depicted in FIG. 7. As depicted in FIG. 9, the second example of a second solder-pad 320b is depicted below the first example of a first solder-pad 310a. The first example of a first solder-pad 310a and the second example of a second solder-pad 320b are each arranged to retain at least one electrical connection of the same first electrical component 410.

In the example depicted in FIG. 9, the first surface 210 comprises the second example of a first mask-free region 710b depicted in FIG. 8. In FIG. 9, the second example of a first mask-free region 710b is depicted below the first example of a first solder-pad 310a. The second example of a first mask-free region 710b is arranged to be adjacent to the second example of a second solder-pad 320b and arranged to be free, or substantially free, of solder-mask 600.

At least a portion of the first surface 210 is arranged to be covered by at least one conformal-coating (not depicted), such that at least a portion of the second example of a first mask-free region 710b and at least a portion of the first example of a first solder-mask region 610a can be covered by the at least one conformal-coating (not depicted), whereby the at least one conformal-coating (not depicted) is in contact with the first surface 210 in at least a portion of the second example of a first mask-free region 710b, and the at least one conformal-coating (not depicted) is in contact with solder-mask 600 in at least a portion of the first example of a first solder-mask region 610a. Optionally, the at least one conformal-coating (not depicted) can be arranged to cover at least a portion of the second example of a second solder-pad 320b, such that the at least one conformal-coating (not depicted) is in contact with at least a portion of the second example of a second solder-pad 320b.

In FIG. 9, the second example of a trace-free region 750b is depicted below the first example of a first solder-pad 310a. Optionally, as depicted in FIG. 9, the second example of a second solder-pad 320b can be arranged to be adjacent to the second example of a trace-free region 750b as depicted in FIG. 7, whereby the second example of a first mask-free region 710b can be comprised in the second example of a trace-free region 750b. The second example of a first mask-free region 710b can optionally be arranged to be free, or substantially free, of traces and conductive-traces. As depicted, in FIG. 9, the first surface 210 optionally can comprise the first example of a second mask-free region 720a depicted in FIG. 8, arranged between the first example of a first solder-mask region 610a and the first example of a first solder-pad 310a. The first example of a second mask-free region 720a can be optionally arranged to allow and/or promote a degree of solder wetting during assembly. Optionally, the first example of a second mask-free region 720a can be arranged to provide a minimum separation of at least 0.04 mm between the first example of a first solder-mask region 610a and the first example of a first solder-pad 310a.

Figure 10:
FIG. 10 is an enlarged view of a second portion of the circuit board in FIG. 1, depicting a top-view of a pad layout, comprised in a board surface.

FIG. 10 shows an enlarged view of a portion of a circuit board, depicting a top-view of a pad layout, comprised in a board surface. In the example depicted in FIG. 10, an enlarged view is depicted of the second board portion 120 of the circuit board in FIG. 1, comprised in the first surface 210. The second board portion 120 depicted in FIG. 10 comprises similar features and functions as the first board portion 110 depicted in FIG. 4. In particular, the second board portion 120 comprises at least one solder-pad 300. For clarity, only a selection of solder-pads 300 are labelled. The second board portion 120 comprises at least one solder-pad 300, arranged to retain at least one electrical connection of at least one electrical component. The second board portion 120 comprises at least one conductive-trace 500. For clarity, only a selection of conductive-traces 500 are labelled.

In the example of FIG. 10, the second board portion 120 comprises at least one solder-pad 300, comprised in the first surface 210, and arranged to retain at least one electrical connection of the second electrical component 420. In the example depicted, the second board portion 120 comprises at least one conductive-trace 500, comprised in the first surface 210.

FIG. 10 also depicts the fourth board portion 140. As depicted, the fourth board portion 140 is comprised in the second board portion 120. The fourth board portion 140 depicted in FIG. 10 comprises similar features and functions as the third board portion 130 depicted in FIG. 4. Further details and enlarged views of the fourth board portion 140 are described below in relation to the other figures.

Figure 11:
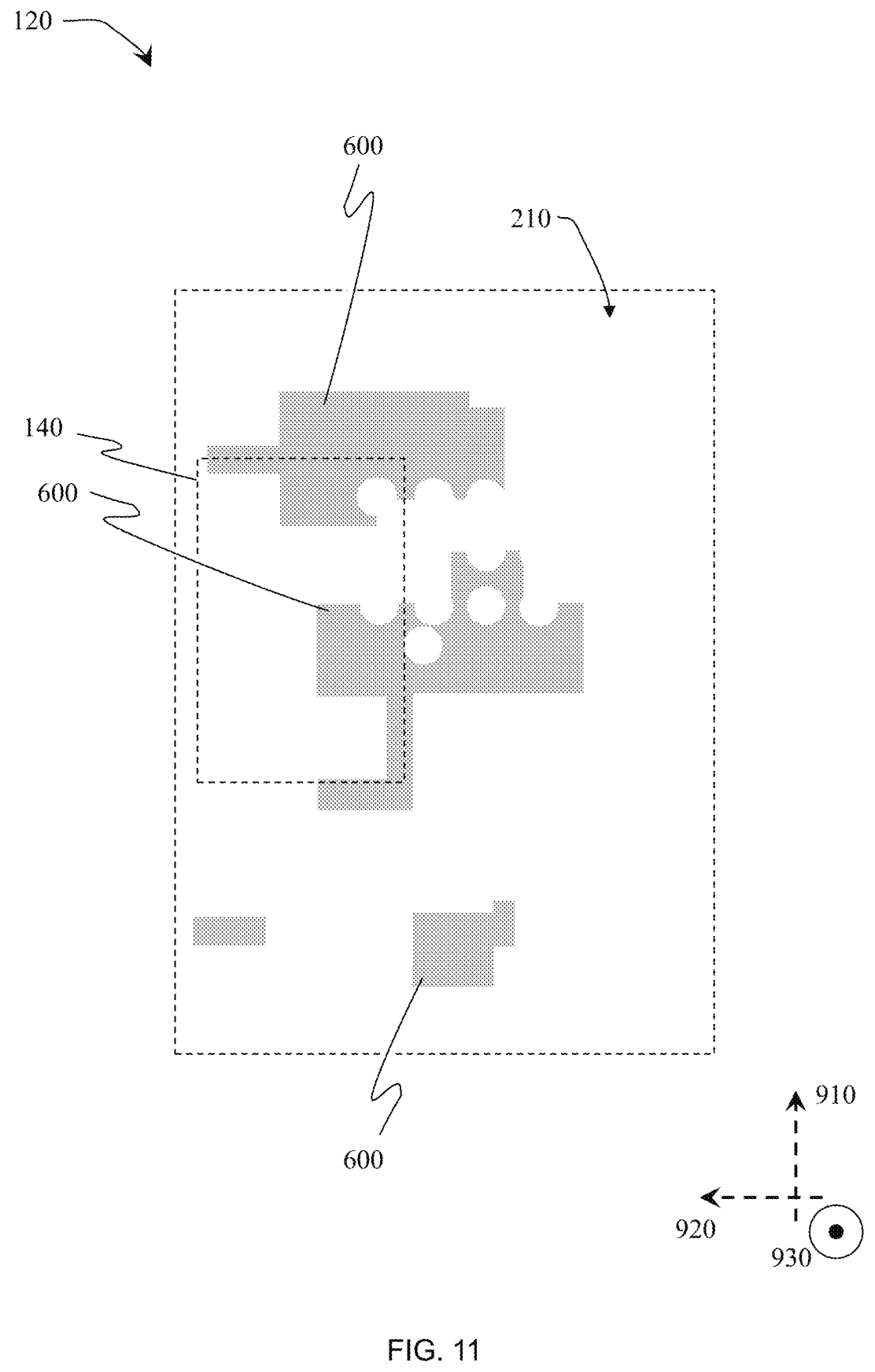

FIG. 11 shows an enlarged view of a portion of a circuit board, depicting a top-view of a solder-mask layout, comprised in a board surface. In the example depicted in FIG. 11, an enlarged view is depicted of the second board portion 120 of the circuit board in FIG. 1, comprised in the first surface 210. The second board portion 120 depicted in FIG. 11 comprises similar features and functions as the first board portion 110 depicted in FIG. 5. The example depicted in FIG. 11 is an enlarged view of the second board portion 120, which is comprised in the circuit board of FIG. 2.

The second board portion 120 comprises at least one region of a solder-mask 600, comprised in the first surface 210. For clarity, only a selection of regions of solder-mask 600 are labelled.

FIG. 11 also depicts the fourth board portion 140. The fourth board portion 140 depicted in FIG. 11 comprises similar features and functions as the third board portion 130 depicted in FIG. 5.

Figure 12:
FIG. 12 is an enlarged view of a second portion of the circuit board in FIG. 1, depicting a top view of a combination of the pad layout in FIG. 10 and the solder-mask layout in FIG. 11, comprised in a board surface.

FIG. 12 shows an enlarged view of a portion of a circuit board, depicting a top-view of a pad layout and a solder-mask layout, comprised in a board surface. In the example depicted in FIG. 12, an enlarged view is depicted of the second board portion 120 of the circuit board in FIG. 1, comprised in the first surface 210. The second board portion 120 depicted in FIG. 12 comprises similar features and functions as the first board portion 110 depicted in FIG. 6. The example depicted in FIG. 12 is an enlarged view of the second board portion 120, which is comprised in the circuit board of FIG. 3. In this example, the solder-mask layout depicted in FIG. 11 is combined with the pad layout depicted in FIG. 10.

The second board portion 120 comprises at least one solder-pad 300 and at least one region of a solder-mask 600, comprised in the first surface 210. For clarity, only a selection of solder-pads 300 and a selection of regions of solder-mask 600 are labelled. In the example of FIG. 12, the first board portion 110 comprises at least one solder-pad 300, comprised in the first surface 210, and arranged to retain at least one electrical connection of the second electrical component 420.

FIG. 12 also depicts the fourth board portion 140. The fourth board portion 140 depicted in FIG. 12 comprises similar features and functions as the third board portion 130 depicted in FIG. 6.

Figure 13:
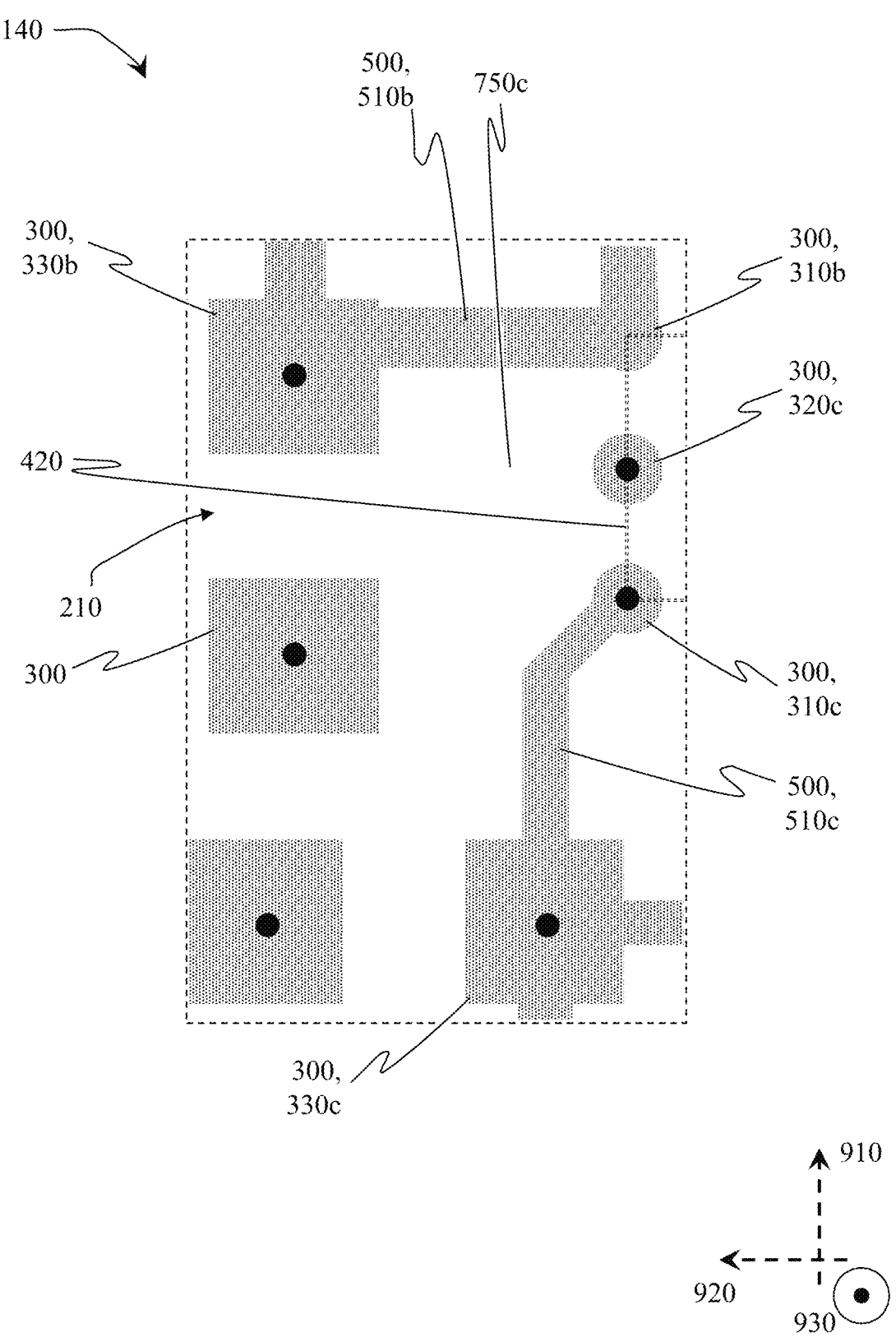
FIG. 13 is an enlarged view of a fourth portion of the circuit board in FIG. 1, and an enlarged view of a portion of the circuit board in FIG. 10, depicting a top-view of a pad layout, comprised in a board surface.

FIG. 13 shows an enlarged view of a portion of a circuit board, depicting a top-view of a pad layout, comprised in a board surface. In the example depicted in FIG. 13, an enlarged view is depicted of the fourth board portion 140 of the circuit board in FIG. 1, comprised in the first surface 210. The fourth board portion 140 depicted in FIG. 13 comprises similar features and functions as the third board portion 130 depicted in FIG. 7. The example depicted in FIG. 13 is an enlarged view of the fourth board portion 140, which is comprised in the second board portion of FIG. 10.

The fourth board portion 140 comprises at least one solder-pad 300. For clarity, only a selection of solder-pads 300 are labelled. The fourth board portion 140 comprises at least one solder-pad 300, arranged to retain at least one electrical connection of at least one electrical component. In the example depicted in FIG. 13, the fourth board portion 140 comprises at least one solder-pad 300, comprised in the first surface 210, arranged to retain at least one electrical connection of the second electrical component 420. The fourth board portion 140 comprises at least one example of a first solder-pad 310, connected to at least one adjacent conductive-trace, and arranged to retain at least one electrical connection of an electrical component. The fourth board portion 140 comprises at least one example of a second solder-pad 320, arranged to retain at least one electrical connection of an electrical component. The first solder-pad 310 and the second solder-pad 320 each are arranged to retain at least one electrical connection of the same electrical component. The fourth board portion 140 comprises at least one example of a third pad 330, connected to at least one example of a conductive-trace 500.

In the example depicted in FIG. 13, the first surface 210 comprises a second example of a first solder-pad 310b and a third example of a second solder-pad 320c. The second example of a first solder-pad 310b and the third example of a second solder-pad 320c each are arranged to retain at least one electrical connection of the second electrical component 420. As depicted in FIG. 13, the second example of a first solder-pad 310b is depicted above the third example of a second solder-pad 320c. As depicted, the third example of a second solder-pad 320c can be optionally arranged to be adjacent to a third example of a trace-free region 750c. As depicted, the third example of a second solder-pad 320c can be optionally arranged to be adjacent, or immediately adjacent, to the second example of a first solder-pad 310b.

In the example depicted in FIG. 13, the first surface 210 comprises a third example of a first solder-pad 310c. The third example of a first solder-pad 310c and the third example of a second solder-pad 320c each are arranged to retain at least one electrical connection of the second electrical component 420. As depicted, the third example of a first solder-pad 310c is depicted below the third example of a second solder-pad 320c. As depicted, the third example of a first solder-pad 310c can be optionally arranged to be adjacent, or immediately adjacent, to the third example of a second solder-pad 320c.

Optionally, a first solder-pad 310 can also be arranged for testing, grounding, thermal relief, heat sinking, or any combination thereof. Additionally or alternatively, a first solder-pad 310 can be at least partially arranged as, or comprise, one or more vias or via holes. In the example depicted in FIG. 13 and FIG. 15, the third-example of a first solder-pad 310c is depicted with a black dot because it is optionally arranged as a one or more vias.

In the example depicted in FIG. 13, the first surface 210 comprises a second example of a third pad 330b and a second example of a first conductive-trace 510b. In FIG. 13, the second example of a third pad 330b is depicted above the third example of a second solder-pad 320c. In FIG. 13, the second example of a first conductive-trace 510b is depicted above the third example of a second solder-pad 320c. The second example of a first conductive-trace 510b is arranged to extend between the second example of a first solder-pad 310b and the second example of a third pad 330b. Optionally, the second example of a first solder-pad 310b can be arranged to be adjacent to the second example of a third pad 330b. The second example of a first conductive-trace 510b is arranged to couple, connect and/or interconnect the second example of a first solder-pad 310b with the second example of a third pad 330b.

In the example depicted in FIG. 13, the first surface 210 comprises a third example of a third pad 330c and a third example of a first conductive-trace 510c. In FIG. 13, the third example of a third pad 330c is depicted below the third example of a second solder-pad 320c. In FIG. 13, the third example of a first conductive-trace 510c is depicted below the third example of a second solder-pad 320c. The third example of a first conductive-trace 510c is arranged to extend between the third example of a first solder-pad 310c and the third example of a third pad 330c. Optionally, the third example of a first solder-pad 310c can be arranged to be adjacent to the third example of a third pad 330c. The third example of a first conductive-trace 510c is arranged to couple, connect and/or interconnect the third example of a first solder-pad 310c with the third example of a third pad 330c.

Figure 14:
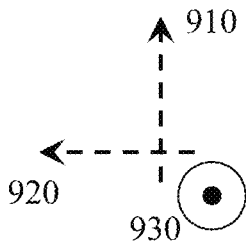
FIG. 14 is an enlarged view of a fourth portion of the circuit board in FIG. 1, and an enlarged view of a portion of the circuit board in FIG. 11, depicting a top-view of a solder-mask, comprised in a board surface, and suitable for use with the pad layout in FIG. 13.

FIG. 14 shows an enlarged view of a portion of a circuit board, depicting a top-view of a solder-mask layout, comprised in a board surface. In the example depicted in FIG. 14, an enlarged view is depicted of the fourth board portion 140 of the circuit board in FIG. 1, comprised in the first surface 210. The fourth board portion 140 depicted in FIG. 14 comprises similar features and functions as the third board portion 130 depicted in FIG. 8. The example depicted in FIG. 14 is an enlarged view of the fourth board portion 140, which is comprised in the second board portion of FIG. 11.

The fourth board portion 140 comprises at least one region of a solder-mask. For clarity, only a selection of regions of solder-mask 600 are labelled. The fourth board portion 140 comprises at least one mask-free region, arranged to be free, or substantially free, of solder-mask 600.

The fourth board portion 140 comprises a second example of a first solder-mask region 610b and a third example of a first solder-mask region 610c, comprised in the first surface 210. In FIG. 14, the second example of a first solder-mask region 610b is depicted above the third example of a first solder-mask region 610c. In the example depicted in FIG. 14, the first surface 210 comprises the second example of a first solder-mask region 610b, arranged to cover at least a portion of the second example of a first conductive-trace depicted in FIG. 13. As depicted in FIG. 14, the first surface 210 comprises a third example of a first solder-mask region 610c, arranged to cover at least a portion of the third example of a first conductive-trace depicted in FIG. 13. In the example depicted in FIG. 14, the first surface 210 comprises the third example of a first mask-free region 710c, arranged to be free, or substantially free, of solder-mask 600.

In the example depicted in FIG. 14, the first surface 210 optionally can comprise a second example of a second mask-free region 720b, proximate the second example of a first solder-mask region 610b. As depicted, the second example of the second mask-free region 720b is optionally arranged as a partial opening in the second example of a first solder-mask region 610b to control, reduce and/or prevent of a degree of solder wetting from a first solder-pad (not depicted) to a third solder-pad (not depicted).

In the example depicted in FIG. 14, the first surface 210 optionally can comprise a third example of a second mask-free region 720c, proximate the third example of a first solder-mask region 610c. As depicted, the third example of the second mask-free region 720c is optionally arranged as a partial opening in the third example of a first solder-mask region 610c to control, reduce and/or prevent of a degree of solder wetting from a first solder-pad (not depicted) to a third solder-pad (not depicted).

Figure 15:
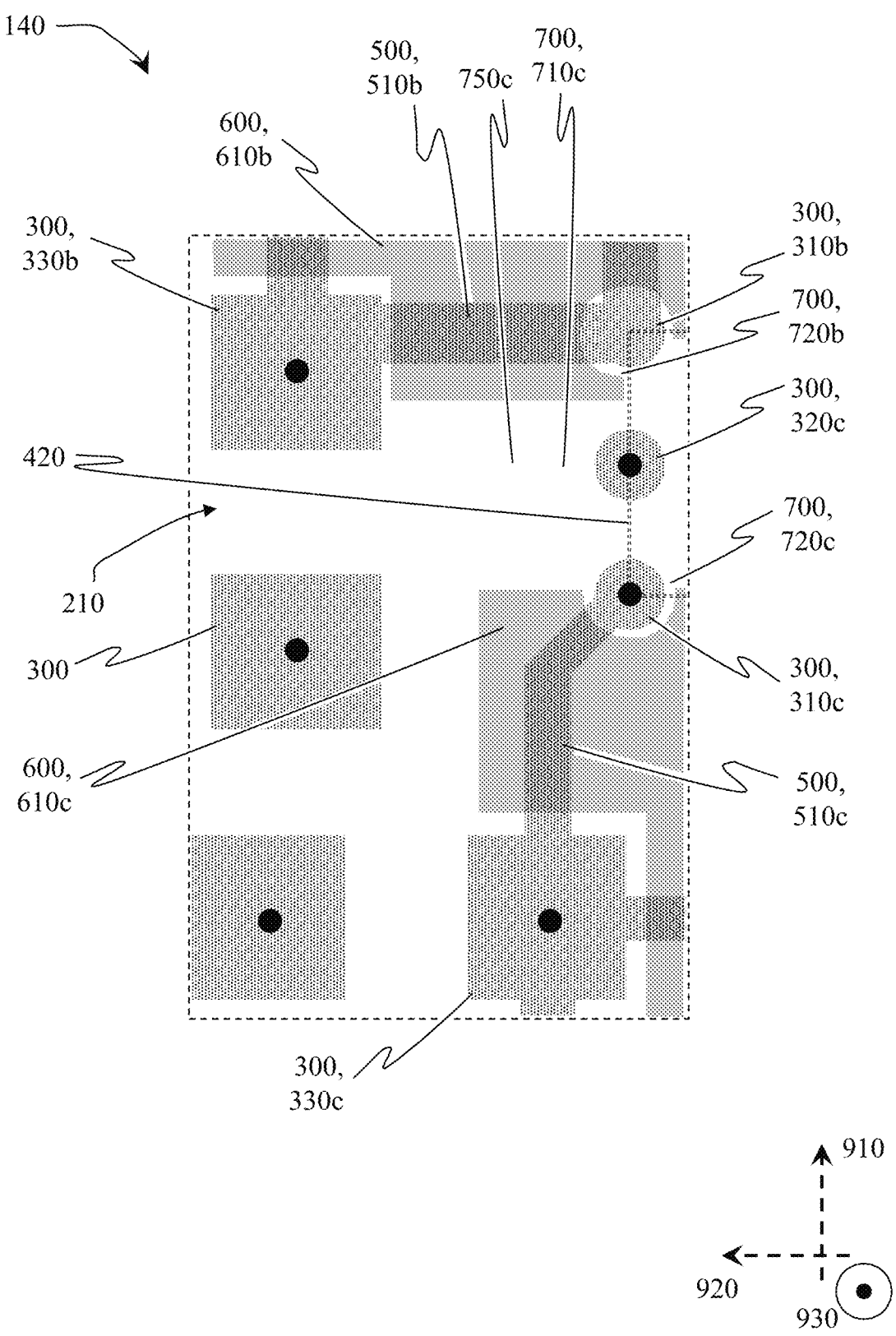
FIG. 15 is an enlarged view of a fourth portion of the circuit board in FIG. 1, and an enlarged view of a portion of the circuit board in FIG. 11, depicting a top-view of a combination of the pad layout in FIG. 13 and the solder-mask layout in FIG. 14, comprised in a board surface.

FIG. 15 shows an enlarged view of a portion of a circuit board, depicting a top-view of a pad layout and a solder-mask layout, comprised in a board surface. In the example depicted in FIG. 15, an enlarged view is depicted of the fourth board portion 140 of the circuit board in FIG. 1, comprised in the first surface 210. The fourth board portion 140 depicted in FIG. 15 comprises similar features and functions as the third board portion 130 depicted in FIG. 9. The example depicted in FIG. 15 is an enlarged view of the fourth board portion 140, which is comprised in the second board portion of FIG. 12. In this example, the solder-mask layout depicted in FIG. 14 is combined with the pad layout depicted in FIG. 13.

The fourth board portion 140 comprises at least one solder-pad and at least one region of a solder-mask, comprised in the first surface 210. For clarity, only a selection of solder-pads 300 and a selection of regions of solder-mask 600 are labelled. As depicted in FIG. 15, the fourth board portion 140 comprises at least one solder-pad 300, comprised in the first surface 210, arranged to retain at least one electrical connection of the second electrical component 420. As depicted, the fourth board portion 140 comprises the second example of a first solder-mask region 610b and the third example of a first solder-mask region 610c as depicted in FIG. 14.

In the example depicted in FIG. 15, the first surface 210 comprises the second example of a first solder-pad 310b and the third example of a second solder-pad 320c depicted in FIG. 13. As depicted, the second example of a first solder-pad 310b is depicted above the third example of a second solder-pad 320. The second example of a first solder-pad 310 and the third example of a second solder-pad 320c are each arranged to retain at least one electrical connection of the same second electrical component 420.

In the example depicted in FIG. 15, the first surface 210 comprises the second example of a third pad 330b and the second example of a first conductive-trace 510b depicted in FIG. 13. The second example of a first conductive-trace 510b is arranged to extend between the second example of a first solder-pad 310b and the second example of a third pad 330*b*. Optionally, the second example of a first solder-pad 310*b* can be arranged to be adjacent to the second example of a third pad 330*b*.

In the example depicted in FIG. 15, the first surface 210 comprises the second example of a first solder-mask region 610*b* depicted in FIG. 14, arranged to cover at least a portion of the second example of a first conductive-trace 510*b*. As depicted in FIG. 15, the first surface 210 comprises the third example of a first mask-free region 710*c* depicted in FIG. 14. The third example of a first mask-free region 710*c* is arranged to be adjacent to the third example of a second solder-pad 320*c* and arranged to be free, or substantially free, of solder-mask 600.

At least a portion of the first surface 210 is arranged to be covered by at least one conformal-coating region (not depicted), such that at least a portion of the third example of a first mask-free region 710*c* and at least a portion of the second example of a first solder-mask region 610*b* can be covered by the at least one conformal-coating (not depicted), whereby the at least one conformal-coating (not depicted) is in contact with the first surface 210 in at least a portion of the third example of a first mask-free region 710*c*, and the at least one conformal-coating (not depicted) is in contact with solder-mask 600 in at least a portion of the second example of a first solder-mask region 610*b*. Optionally, the at least one conformal-coating (not depicted) can be arranged to cover at least a portion of the third example of a second solder-pad 320*c*, such that the at least one conformal-coating (not depicted) is in contact with at least a portion of the third example of a second solder-pad 320*c*.

Optionally, as depicted in FIG. 15, the third example of a second solder-pad 320*c* can be arranged to be adjacent to the third example of a trace-free region 750*c* as depicted in FIG. 13, whereby the third example of a first mask-free region 710*c* can be comprised in the third example of a trace-free region 750*c*. The third example of a first mask-free region 710*c* can optionally be arranged to be free, or substantially free, of traces and conductive-traces. Optionally, the at least one conformal-coating (not depicted) can be arranged to cover at least a portion of the second example of a first solder-pad 310*b*, such that the at least one conformal-coating (not depicted) is in contact with at least a portion of the second example of a first solder-pad 310*b*. Optionally, the at least one conformal-coating (not depicted) can be arranged to cover at least a portion of the second example of a third pad 330*b*, such that the at least one conformal-coating (not depicted) is in contact with at least a portion of the second example of a third pad 330*b*.

In the example depicted in FIG. 15, the second example of a first solder-mask region 610*b* is arranged to control, reduce and/or prevent of a degree of solder wetting during assembly away from the second example of a first solder-pad 310*b*, along the second example of a first conductive-trace 510*b*, towards the second example of a third pad 330*b*. The degree of wetting control is related to one or more properties of the second example of a first solder-mask region 610*b*, including a degree of coverage of the second example of a first conductive-trace 510*b*. Optionally, the second example of a first solder-mask region 610*b* can be arranged to cover at least a portion of the second example of a third pad 330*b*. Optionally, the second example of a first solder-mask region 610*b* can be arranged to cover all, or substantially all, or approximately all, of the second example of a third pad 330*b*.

Similarly, the example of FIG. 15 depicts the third example of a first solder-pad 310*c* depicted in FIG. 13. As depicted in FIG. 15, the third example of a first solder-pad 310*c* is depicted below the third example of a second solder-pad 320*c*. The third example of a first solder-pad 310*c* and the third example of a second solder-pad 320*c* are each arranged to retain at least one electrical connection of the same second electrical component 420.

In the example depicted in FIG. 15, the first surface 210 comprises the third example of a first mask-free region 710*c* depicted in FIG. 14. The third example of a first mask-free region 710*c* is arranged to be adjacent to the third example of a second solder-pad 320*c* and arranged to be free, or substantially free, of solder-mask 600.

At least a portion of the first surface 210 is arranged to be covered by at least one conformal-coating (not depicted), such that at least a portion of the third example of a first mask-free region 710*c* and at least a portion of the third example of a first solder-mask region 610*c* can be covered by the at least one conformal-coating (not depicted), whereby the at least one conformal-coating (not depicted) is in contact with the first surface 210 in at least a portion of the third example of a first mask-free region 710*c*, and the at least one conformal-coating (not depicted) is in contact with solder-mask 600 in at least a portion of the third example of a first solder-mask region 610*c*. Optionally, the at least one conformal-coating (not depicted) can be arranged to cover at least a portion of the third example of a second solder-pad 320*c*, such that the at least one conformal-coating (not depicted) is in contact with at least a portion of the third example of a second solder-pad 320*c*.

Optionally, as depicted in FIG. 15, the third example of a second solder-pad 320*c* can be arranged to be adjacent to the third example of a trace-free region 750*c* as depicted in FIG. 13, whereby the third example of a first mask-free region 710*c* can be comprised in the third example of a trace-free region 750*c*. The third example of a first mask-free region 710*c* can optionally be arranged to be free, or substantially free, of traces and conductive-traces.

In the example depicted in FIG. 15, the first surface 210 optionally can comprise the second example of a second mask-free region 720*b* depicted in FIG. 14, arranged between the second example of a first solder-mask region 610*b* and the second example of a first solder-pad 310*b*. In FIG. 15, the second example of a second mask-free region 720*b* is depicted above the third example of a second solder-pad 320*c*. The second example of a second mask-free region 720*b* can be optionally arranged to allow and/or promote a degree of solder wetting during assembly. Optionally, the second example of a second mask-free region 720*b* can be arranged to provide a minimum separation of at least 0.04 mm between the second example of a first solder-mask region 610*b* and the second example of a first solder-pad 310*b*.

In the example depicted in FIG. 15, the first surface 210 optionally can comprise the third example of a second mask-free region 720*c* depicted in FIG. 14, arranged between the third example of a first solder-mask region 610*c* and the third example of a first solder-pad 310*c*. In FIG. 15, the third example of a second mask-free region 720*c* is depicted below the third example of a second solder-pad 320*c*. The third example of a second mask-free region 720*c* can be optionally arranged to allow and/or promote a degree of solder wetting during assembly. Optionally, the third example of a second mask-free region 720*c* can be arranged to provide a minimum separation of at least 0.04 mm between the third example of a first solder-mask region 610*c* and the third example of a first solder-pad 310.

Figure 16:
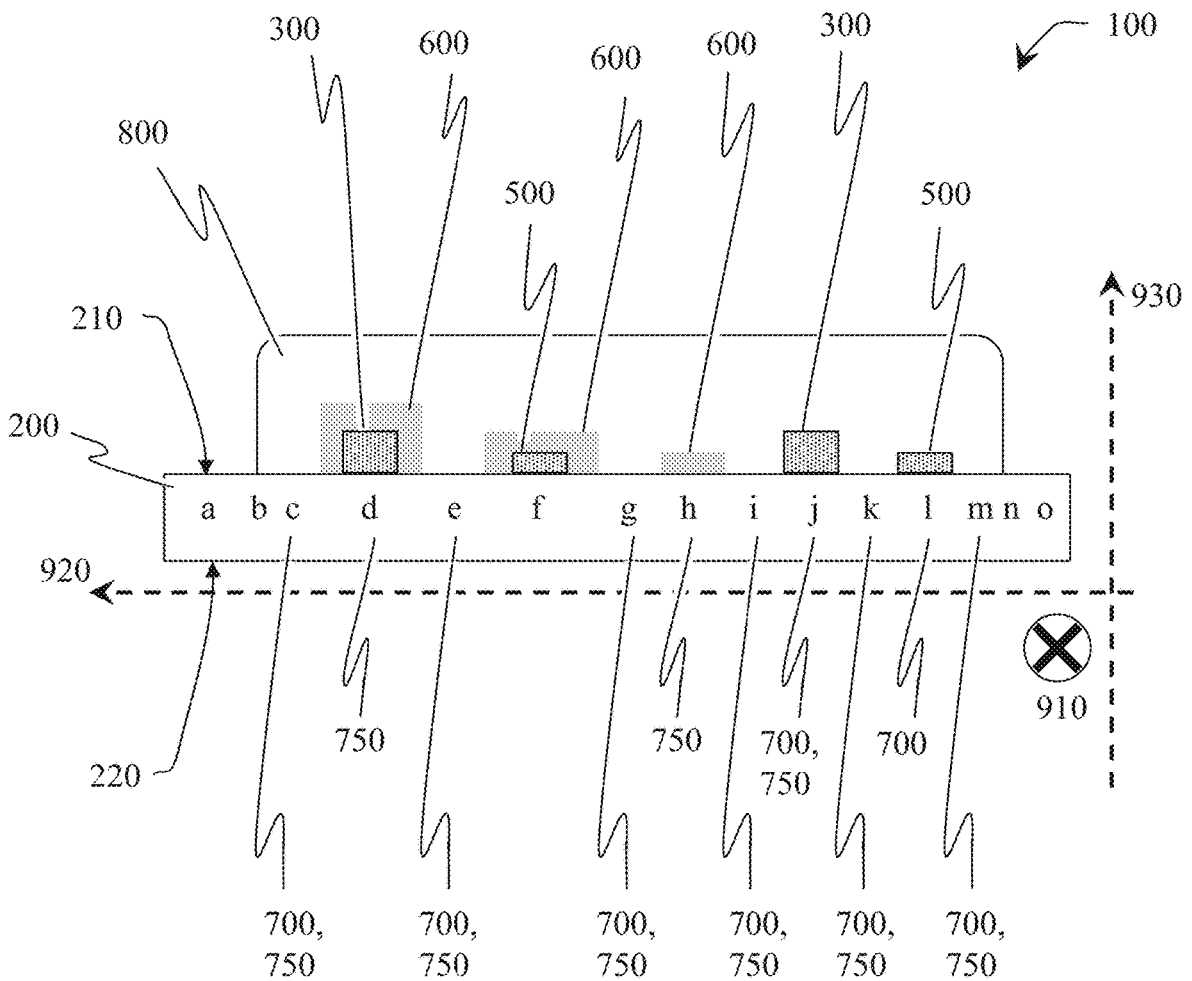
FIG. 16 is a schematic cross-section depicting examples of different layers of a portion of a circuit board and one or more conformal-coatings.

FIG. 16 is a schematic cross-section depicting examples of different layers of a portion of a circuit board and one or more conformal-coatings.

In the example depicted in FIG. 16, the circuit board 100 comprises at least one conformal-coating 800, arranged to be disposed over, or to cover, at least a portion of the first surface 210. A conformal-coating 800 is arranged to at least partially conform to at least a portion of the first surface 210 to which it is applied. At least a portion of the first surface 210 is arranged to receive and retain the at least one conformal-coating 800. The at least one conformal-coating 800 is arranged to cover at least a portion of a mask-free region 700, such that the at least one conformal-coating 800 is in contact with the first surface 210 in at least a portion of the mask-free region 700. The at least one conformal-coating 800 is further arranged to cover at least a portion of a solder-mask region 600, such that the at least one conformal-coating 800 is in contact with solder-mask 600 in at least a portion of the solder-mask region 600.

In the context of this disclosure "in contact" means that there are no substantial additional layers between the two extents. Thin coatings or surface treatments, such as a solder-pad coating or a solder paste are not considered as substantial additional layers. A solder-pad coating, or finish, is a suitable material which can at least partially coat a surface of a solder-pad and/or conductive material, such as Electroless Nickel/Immersion Gold (ENIG), Hot Air Solder Leveling (HASL), Organic Solderability Preservative (OSP), immersion silver, or any combination thereof. A solder-pad coating can be arranged to improve solderability and/or corrosion resistance. A solder-pad coating usually forms a thin layer, with a thickness that depends on the type of coating, how it is applied, and the required properties. For example, an ENIG coating can be approximately in the range of 3 to 6 μm (micron), a HASL coating can be approximately 1 to 40 μm (micron), an OSP coating can be approximately 0.2 to 0.5 μm (micron), an immersion silver coating can be approximately 0.1 to 0.4 μm. A solder-pad coating can similarly at least partially coat a surface of a conductive-trace. A solder paste is a suitable material arranged to hold one or more components and/or to facilitate soldering.

The at least one conformal-coating 800 can comprise one or more materials suitable for one or more intended uses of the circuit board, and in particular one or more intended uses of the portion of the first surface 210 covered by the at least one conformal-coating 800. Additionally, or alternatively, one or more conformal-coatings 800 can be applied in layers, adjacent regions, immediately adjacent regions, contiguous regions, non-contiguous regions, or any combination thereof.

Providing one or more conformal-coatings 800 can also be described as encapsulation. A reliable degree of encapsulation can be advantageous if the circuit board is arranged to be at least partially submersible and/or implantable. For example, a suitable conformal-coating material can be at least one acrylic, at least one polyacrylate, at least one polyurethane, at least one polyurethane resin, at least one silicone, at least one silicone polymer, at least one epoxy, at least one epoxy resin, at least one resin, at least one adhesive, at least one glue, at least one parylene, at least one rubber, at least one polydimethylsiloxane rubber (PDMS), or any combination thereof. For example, a conformal-coating can be a protective polymer applied to protect from environmental stresses, such as moisture, humidity, dust, debris, corrosive fluids, bodily fluids, corrosive gasses, corrosive vapors, chemicals, mechanical abrasion, temperature, vibration, electrical charge, electrical energy, RF energy, or any combination thereof.

FIG. 16 depicts several examples of possible layers, features and feature-layer combinations. From left-to-right, in the negative direction of the second axis 920, the following are depicted: (a) a portion of the first surface 210 that is not covered by the at least one conformal-coating 800; (b) an extent along the second axis 920 (or edge) of the at least one conformal-coating 800; (c) a mask-free region 700 covered by the at least one conformal-coating 800 which is also a trace-free region 750; (d) a solder-pad 300 covered by a solder-mask region 600 and covered by the at least one conformal-coating 800 which is also a trace-free region 750; (e) a mask-free region 700 covered by the at least one conformal-coating 800 which is also a trace-free region 750; (f) a conductive-trace 500 covered by a solder-mask region 600 and covered by the at least one conformal-coating 800; (g) a mask-free region 700 covered by the at least one conformal-coating 800 which is also a trace-free region 750; (h) a trace-free region 750 which is covered by a solder-mask region 600 and covered by the at least one conformal-coating 800; (i) a mask-free region 700 covered by the at least one conformal-coating 800 which is also a trace-free region 750; (j) a mask-free region 700 with a solder-pad 300 covered by the at least one conformal-coating 800 which is also a trace-free region 750; (k) a mask-free region 700 covered by the at least one conformal-coating 800 which is also a trace-free region 750; (l) a mask-free region 700 with a conductive-trace 500 covered by the at least one conformal-coating 800; (m) a mask-free region 700 covered by the at least one conformal-coating 800 which is also a trace-free region 750; (n) an extent along the second axis 920 (or edge) of the at least one conformal-coating 800; and (o) a portion of the first surface 210 that is not covered by the at least one conformal-coating 800.

Optionally, the at least one conformal-coating 800 can be arranged to cover all, or substantially all, of the first surface 210. Additionally or alternatively, the at least one conformal-coating 800 can be arranged to cover one or more additional portions of the substrate 200. Additionally or alternatively, the at least one conformal-coating 800 can be arranged to cover at least one surface of the substrate 200. Additionally or alternatively, the at least one conformal-coating 800 can be arranged to cover more than one surface of the substrate 200. Additionally or alternatively, the at least one conformal-coating 800 can be arranged to cover all, or substantially all, surfaces of the substrate 200.

Optionally, the circuit board 100 can comprise a second surface 220. Additionally or alternatively, the at least one conformal-coating 800 can be arranged to cover at least a portion of the second surface 220. Additionally or alternatively, the at least one conformal-coating 800 can be arranged to cover at least a portion of the first surface 210 and at least a portion of the second surface 220. Additionally or alternatively, the second surface 220 can be arranged to be covered by at least one further conformal-coating (not depicted). Additionally or alternatively, the second surface 220 can be arranged to comprise one or more similar features to those described herein in relation to the first surface 210.

Figure 17:
FIG. 17 is an enlarged view of a first portion of the circuit board in FIG. 1, depicting a combination of the pad layout in FIG. 4 and the solder-mask layout in FIG. 5, comprised in a board surface.
Figure 17:
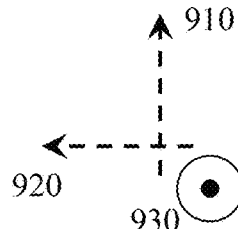

FIG. 17 shows an enlarged view of a portion of a circuit board, depicting a top-view of a pad layout and a solder-mask layout, comprised in a board surface. FIG. 17 is the same view as depicted in FIG. 6, but with a different labelling of features.

In the example depicted in FIG. 17, an enlarged view is depicted of the first board portion 110 of the circuit board in FIG. 1, comprised in the first surface 210. The example depicted in FIG. 6 is an enlarged view of the first board portion 110, which is comprised in the circuit board of FIG. 3. In this example, the solder-mask layout depicted in FIG. 5 is combined with the pad layout depicted in FIG. 4.

The first board portion 110 comprises at least one solder-pad 300, at least one conductive-trace 500, at least one region of a solder-mask 600, and at least one mask-free region 700, comprised in the first surface 210. For clarity, only a selection of solder-pads 300, conductive-traces 500, regions of solder-mask 600 and mask-free regions 700 are labelled.

Optionally, at least one mask-free region 700 and/or at least one solder-mask region 600 can be arranged to be at least partially trace-free or trace-free. For clarity, only a selection of the optional one or more trace-free regions 750 are labelled. In the example depicted in FIG. 17, one or more mask-free regions 700 are optionally arranged to also be trace-free regions 750.

In the example of FIG. 17, the first board portion 110 comprises a first solder-mask region 610, a second solder-mask region 620, a third solder-mask region 630, a fourth solder-mask region 640 and at least one mask-free region 700. As depicted, at least a portion of the first surface 210 is arranged to be receive and retain at least one conformal-coating (not depicted).

Figure 18:
FIG. 18 is the same view as in FIG. 17, depicting a top view after applying a conformal-coating as an example of a conformal-coating region.
Figure 18:
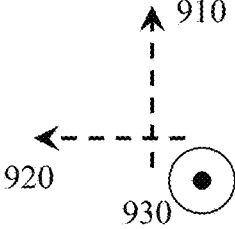

FIG. 18 also depicts the third board portion 130, comprising at least one solder-pad 300, at least one conductive-trace 500, at least one region of a solder-mask 600, and at least one mask-free region 700, comprised in the first surface 210. For clarity, only a selection of solder-pads 300, conductive-traces 500, regions of solder-mask 600 and mask-free regions 700 are labelled.

FIG. 18 shows the same view as in FIG. 17, but depicting a top view after applying at least one conformal-coating 800 as a conformal-coating region, wherein the at least one conformal-coating 800 is in contact with at least a portion of the first surface 210 in at least one mask-free region 700. Also, the at least one conformal-coating 800 is in contact with at least a portion of solder-mask 600 in at least one solder-mask region 600.

In the example depicted in FIG. 18, the at least one conformal-coating 800 is applied as a first conformal-coating region 810, arranged to partially cover the first board portion 110 and to fully cover the third board portion 130.

In the context of this disclosure, "fully covers" means that the peripheral extents of the at least one conformal-coating 800, along the first axis 910 and second axis 920, coincide with, or exceed, one or more comparable peripheral extents, along the first axis 910 and second axis 920, of an object being fully covered. Optionally, at least one mask-free region 700 can be provided at one or more peripheral extents of the object being fully covered, and the at least one conformal-coating 800 can be arranged to be in contact with at least a portion of the first surface 210 in the at least one mask-free region 700.

In the example depicted in FIG. 18, the first conformal-coating region 810 is optionally arranged to fully cover at least the first solder-mask region 610, the second solder-mask region 620, the third solder-mask region 630, the fourth solder-mask region 640, and at least one mask-free region 700. In the example depicted, at least the first solder-mask region 610, the second solder-mask region 620, the third solder-mask region 630, and the fourth solder-mask region 640 form islands of solder-mask 600 under the first conformal-coating region 810, wherein at least a portion of at least one adjacent mask-free region 700 extends along a perimeter of the at least one solder-mask region.

Optionally, at least one mask-free region 700 can be arranged to be at least partially trace-free or trace-free. For clarity, only a selection of the optional one or more trace-free regions 750 are labelled. In the example depicted in FIG. 18, one or more mask-free regions 700 are optionally arranged to also be trace-free regions 750.

In the example depicted in FIG. 18, different areas of solder-mask 600, 610, 620, 630, 640 are covered by the first conformal-coating region 810. Similar to the calculation used for the examples depicted in FIG. 23A to FIG. 23T, the first conformal-coating region 810 is arranged to cover a conformal-coating area (C) of at least a portion of the first surface 210, and the first conformal-coating region 810 is arranged to cover a solder-mask area (M) of the first solder-mask region 610, the second solder-mask region 620, the third solder-mask region 630, and the fourth solder-mask region 640. Additionally or alternatively, the first conformal-coating region 810 can be arranged to cover a mask-free area (F) of the at least one mask-free region 700. For clarity, the first solder-mask region 610, the second solder-mask region 620, the third solder-mask region 630, and the fourth solder-mask region 640 are indicated as one or more non-contiguous dark-gray squares. In this example, all regions not comprising a solder-mask region 600, 610, 620, 630, 640 are assumed to be mask-free regions 700, and are indicated with no color. The solder-mask area (M) and the conformal-coating area (C) can be measured in any suitable units, such as square millimeters (mm2).

For the example of FIG. 18, the conformal-coating area (C) is 67.5 mm2, the first solder-mask region 610 is 1.0 mm2, the second solder-mask region 620 is 3.5 mm2, the third solder-mask region 630 is 4.1 mm2, and the fourth solder-mask region 640 is 4.7 mm2.

| FIG. | solder-mask area (M) | mask-free (F) | M:C | F:C |
|------|----------------------|---------------|-----|-----|
| 18 | 4 × regions => 13.3 mm2 | 54.2 mm2 | 20% | 80% |

By reducing and/or minimizing a use of at least one solder-mask region 610, 620, 630, 640 to control, reduce and/or prevent a degree of solder wetting along at least one conductive-trace 500, and by also not using solder-mask 600 in at least one adjacent mask-free region 700, the at least one solder-mask region 610, 620, 630, 640 can be more reliably encapsulated. An improved encapsulation can be particularly advantageous adjacent to one or more electrical components and/or adjacent to one or more electrical connections.

As depicted in the example of FIG. 18, the first conformal-coating region 810 is optionally arranged to fully cover all of the one or more conductive-traces 500 comprised in the first surface 210.

Optionally, the first conformal-coating region 810 is arranged to cover at least a portion of at least one solder-pad 300. In the example of FIG. 18, the first conformal-coating region 810 is optionally arranged to cover and/or fully cover a plurality of pads and/or solder-pads 300.

Optionally, the first conformal-coating region 810 is arranged to cover at least a portion of at least one electrical connection for at least one electrical component. In the example of FIG. 18, the first conformal-coating region 810 is optionally arranged to cover and/or fully cover a plurality of electrical connections. As depicted in the example of FIG. 18, the first conformal-coating region 810 is optionally arranged to fully cover all of the electrical connections, comprised in the first surface 210, for the first electrical component 410.

Optionally, the first conformal-coating region 810 is arranged to cover or fully cover at least a portion of at least one electrical component. In the example of FIG. 18, the first conformal-coating region 810 is optionally arranged to fully cover the first electrical component 410.

Optionally, adhesion of the at least one at least one conformal-coating 800 can be improved by selecting one or more materials which are suitable for adhesion to at least a portion of the first surface 210 in the at least one mask-free region 700 and/or for adhesion to at least a portion of solder-mask 600 in the at least one solder-mask region 600, 610, 620, 630, 640.

Optionally, encapsulation can be improved by further reducing a number and/or an extent of solder-mask regions 600, 610, 620, 630, 640 at least partially covered by the first conformal-coating region 810. For example, one or more solder-mask regions 600, 610, 620, 630, 640 can be replaced by one or more mask-free regions 700. This is particularly advantageous for circuit boards that are to be implanted because a high degree of corrosion resistance can contribute to a higher level of reliability.

For the example depicted in FIG. 18, it can be advantageous to optionally extend the first conformal-coating region 810 to fully cover all pads and solder-pads 300 comprised in the first surface 210.

Optionally, the first conformal-coating 800 can be extended to cover one or more further solder-mask regions (not depicted). Additionally or alternatively, one or more solder-mask regions 600 can also be arranged to be at least partially trace-free or trace-free. Optionally, at least one solder-mask region 610, 620, 630, 640 can be arranged to be at least partially trace-free or trace-free. Additionally or alternatively, one or more protective coatings can be applied to one or more pads and/or one or more conductive-traces to provide a degree of corrosion protection instead of applying solder-mask 600.

Optionally, the first conformal-coating region 810 can be arranged to cover only a portion of the at least one solder-mask region 600. Optionally, the first conformal-coating region 810 can be arranged to cover only a portion of the first solder-mask region 610, the second solder-mask region 620, the third solder-mask region 630, the fourth solder-mask region 640, or any combination thereof.

Optionally, the first conformal-coating region 810 can be optionally arranged to only cover a portion of the electrical connections for the first electrical component 410 and/or a portion of the first electrical component 410. Additionally or alternatively, the first conformal-coating region 810 can be arranged to only cover a portion of the one or more conductive-traces 500.

Figure 19:
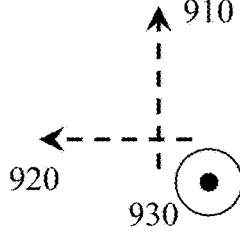
FIG. 19 is an enlarged view of a first portion of the circuit board in FIG. 1, depicting a combination of the pad layout in FIG. 4 and a solder-mask free layout, comprised in a board surface.

FIG. 19 shows an enlarged view of a first portion of the circuit board in FIG. 1, depicting a combination of the pad layout in FIG. 4 and a solder-mask free layout, comprised in a board surface. FIG. 19 is the same view as depicted in FIG. 6, but with a different labelling of features and no solder-mask regions. FIG. 19 is also the same view as depicted in FIG. 17, but with a different labelling of features and no solder-mask regions.

In the example depicted in FIG. 19, an enlarged view is depicted of the first board portion 110 of the circuit board in FIG. 1, comprised in the first surface 210. The example depicted in FIG. 6 is an enlarged view of the first board portion 110, which is comprised in the circuit board of FIG.

30

3. In this example, the solder-mask layout depicted in FIG. 5 is not used, or used and removed, to provide a mask-free region 700 with the pad layout depicted in FIG. 4.

The first board portion 110 comprises at least one solder-pad 300, at least one conductive-trace 500, and at least one mask-free region 700, comprised in the first surface 210. For clarity, only a selection of solder-pads 300, conductive-traces 500, and mask-free regions 700 are labelled.

In the example of FIG. 19, the first board portion 110 comprises a plurality of contiguous mask-free regions 700. Optionally, at least one mask-free region 700 can be arranged to be at least partially trace-free or trace-free. For clarity, only a selection of the optional one or more trace-free regions 750 are labelled. In the example depicted in FIG. 19, one or more mask-free regions 700 are optionally arranged to also be trace-free regions 750.

In the example of FIG. 19, the first board portion 110 comprises at least one mask-free region 700.

FIG. 19 also depicts the third board portion 130. In this example, the third board portion 130 comprises at least one mask-free region 700. As depicted, at least a portion of the first surface 210 is arranged to be receive and retain at least one conformal-coating (not depicted).

Figure 20:
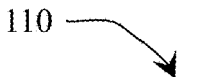
FIG. 20 is the same view as in FIG. 19, depicting a top view after applying a conformal-coating as an example of a conformal-coating region.
Figure 20:
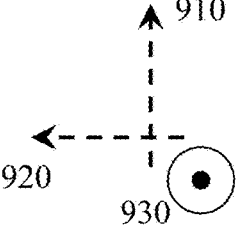

FIG. 20 shows the same view as in FIG. 19, but depicting a top view after applying at least one conformal-coating 800 as a conformal-coating region, wherein the at least one conformal-coating 800 is in contact with at least a portion of the first surface 210 in at least one mask-free region 700. In the example depicted in FIG. 20, the at least one conformal-coating 800 is applied as a second conformal-coating region 820, arranged to partially cover the first board portion 110 and to fully cover the third board portion 130.

In the example depicted in FIG. 20, the second conformal-coating region 820 is optionally arranged to partially cover at least one mask-free region 700.

Optionally, at least one mask-free region 700 can be arranged to be at least partially trace-free or trace-free. For clarity, only a selection of the optional one or more trace-free regions 750 are labelled. In the example depicted in FIG. 20, one or more mask-free regions 700 are optionally arranged to also be trace-free regions 750.

In the example depicted in FIG. 20, no areas of solder-mask are covered by second conformal-coating region 820. Similar to the calculation used in the examples depicted in FIG. 23A to FIG. 23T, the second conformal-coating region 820 is arranged to cover a conformal-coating area (C) of at least a portion of the first surface 210, and the second conformal-coating region 820 is arranged to cover no solder-mask area (M). Additionally or alternatively, the first conformal-coating region 810 can be arranged to cover a mask-free area (F) of the at least one mask-free region 700. In this example, all regions not comprising a solder-mask region are assumed to be mask-free regions 700, and are indicated with no color. The solder-mask area (M) and the conformal-coating area (C) can be measured in any suitable units, such as square millimeters (mm2).

For the example of FIG. 20, the conformal-coating area (C) is 67.5 mm2, with no regions of solder-mask.

| FIG. | solder-mask area (M) | mask-free (F) | M:C | F:C |
|---|---|---|---|---|
| 20 | 0 × regions => 00.0 mm2 | 67.5 mm2 | 00% | 100% |

By using substantially no solder-mask to control, reduce and/or prevent a degree of solder wetting along at least one conductive-trace 500, the at least one mask-free region 700 can be more reliably encapsulated. An improved encapsulation can be particularly advantageous adjacent to one or more electrical components and/or adjacent to one or more electrical connections.

As depicted in the example of FIG. 20, the second conformal-coating region 820 is optionally arranged to fully cover all of the one or more conductive-traces 500 comprised in the first surface 210. Optionally, the second conformal-coating region 820 is arranged to cover at least a portion of at least one solder-pad 300. In the example of FIG. 20, the second conformal-coating region 820 is optionally arranged to cover and/or fully cover a plurality of pads and/or solder-pads 300.

Optionally, the second conformal-coating region 820 is arranged to cover at least a portion of at least one electrical connection for at least one electrical component. In the example of FIG. 20, the second conformal-coating region 820 is optionally arranged to cover and/or fully cover a plurality of electrical connections. As depicted in the example of FIG. 20, the second conformal-coating region 820 is optionally arranged to fully cover all of the electrical connections, comprised in the first surface 210, for the first electrical component 410.

Optionally, the second conformal-coating region 820 is arranged to cover or fully cover at least a portion of at least one electrical component. In the example of FIG. 20, the second conformal-coating region 820 is optionally arranged to fully cover the first electrical component 410.

Optionally, adhesion of the at least one conformal-coating 800 can be improved by selecting one or more materials which are suitable for adhesion to at least a portion of the first surface 210 in the at least one mask-free region 700.

Encapsulation can be improved by omitting and/or removing all regions of solder-mask. This is particularly advantageous for circuit boards that are to be implanted because a high degree of corrosion resistance can contribute to a higher level of reliability.

For the example depicted in FIG. 20, it can be advantageous to optionally extend the second conformal-coating region 820 to fully cover all pads and solder-pads 300 comprised in the first surface 210.

Additionally or alternatively, one or more protective coatings can be applied to one or more pads and/or one or more conductive-traces to provide a degree of corrosion protection instead of applying solder-mask.

Optionally, the second conformal-coating region 820 can be optionally arranged to only cover a portion of the electrical connections for the first electrical component 410 and/or a portion of the first electrical component 410. Additionally or alternatively, the second conformal-coating region 820 can be arranged to only cover a portion of the one or more conductive-traces 500.

Figure 21:
FIG. 21 is an enlarged view of a second portion of the circuit board in FIG. 1, depicting a top view of a combination of the pad layout in FIG. 10 and the solder-mask layout in FIG. 11, comprised in a board surface, and after applying a conformal-coating as an example of a conformal-coating region.

FIG. 21 shows an enlarged view of a portion of a circuit board, depicting a top-view of a pad layout and a solder-mask layout, comprised in a board surface. As depicted, FIG. 21 shows an enlarged view of the second board portion 120 of the circuit board in FIG. 1, comprised in the first surface 210. In this example, the solder-mask layout depicted in FIG. 11 is combined with the pad layout depicted in FIG. 10. The second board portion 120 comprises at least one solder-pad 300, at least one conductive-trace 500, at least one region of a solder-mask 600, and at least one mask-free region 700, comprised in the first surface 210. The second board portion 120 comprises at least one solder-pad 300, comprised in the first surface 210, and arranged to retain at least one electrical connection of the second electrical component 420.

FIG. 21 also depicts the fourth board portion 140. The fourth board portion 120 comprises at least one solder-pad 300, at least one conductive-trace 500, at least one region of a solder-mask 600, and at least one mask-free region 700, comprised in the first surface 210. For clarity, only a selection of solder-pads 300, mask-free regions 700, and conductive-traces 500 are labelled.

FIG. 21 is the same view as depicted in FIG. 12, but with a different labelling of features, and after applying at least one conformal-coating 800 as a conformal-coating region, wherein the at least one conformal-coating 800 is in contact with at least a portion of the first surface 210 in at least one mask-free region 700. Also, the at least one conformal-coating 800 is in contact with at least a portion of solder-mask 600 in at least one solder-mask region 600. In the example depicted, the at least one conformal-coating 800 is applied as a third conformal-coating region 830, arranged to partially cover the second board portion 120 and to fully cover the fourth board portion 140.

In the example of FIG. 21, the second board portion 120 comprises a first solder-mask region 610, a second solder-mask region 620, a third solder-mask region 630, and a fourth solder-mask region 640. As depicted, the fourth board portion 140 comprises a portion of the first solder-mask region 610, a portion of the second solder-mask region 620, and at least one mask-free region 700.

In the example of FIG. 21, the third conformal-coating region 830 is optionally arranged to fully cover the first solder-mask region 610, a portion of the second solder-mask region 620, and at least one mask-free region 700. The third conformal-coating region 830 is optionally arranged to not cover the third solder-mask region 630 and the fourth solder-mask region 640. In the example depicted, at least the first solder-mask region 610 forms an island of solder-mask 600 under the third conformal-coating region 830, wherein at least a portion of at least one adjacent mask-free region 700 extends along a perimeter of the first solder-mask region 610.

Optionally, at least one mask-free region 700 can be arranged to be at least partially trace-free or trace-free. For clarity, only a selection of the optional one or more trace-free regions 750 are labelled. In the example depicted in FIG. 21, one or more mask-free regions 700 are optionally arranged to also be trace-free regions 750.

In the example depicted in FIG. 21, different areas of solder-mask 600, 610, 620, are covered by the third conformal-coating region 830. Similar to the calculation used for the examples depicted in FIG. 23A to FIG. 23T, the third conformal-coating region 830 is arranged to cover a conformal-coating area (C) of at least a portion of the first surface 210, and the third conformal-coating region 830 is arranged to cover a solder-mask area (M) of the first solder-mask region 610 and the second solder-mask region 620. Optionally, the third solder-mask region 630 and the fourth solder-mask region 640 are not covered. Additionally or alternatively, the third conformal-coating region 830 can be arranged to cover a mask-free area (F) of the at least one mask-free region 700. For clarity, the first solder-mask region 610, the second solder-mask region 620, the third solder-mask region 630, and the fourth solder-mask region 640 are indicated as one or more non-contiguous dark-gray squares. In this example, all regions not comprising a solder-mask region 600, 610, 620, 630, 640 are assumed to be mask-free regions 700, and are indicated with no color. The solder-mask area (M) and the conformal-coating area (C) can be measured in any suitable units, such as square millimeters (mm2).

For the example of FIG. 21, the conformal-coating area (C) is 51.0 mm², the first solder-mask region 610 is 9.4 mm², and the second solder-mask region 620 is 7.4 mm2. In this example, only 6.0 mm2 of the second solder-mask region 620 is covered. The third solder-mask region 630 is 1.9 mm2, but not covered. The fourth solder-mask region 640 is 0.6 mm2, but not covered.

| FIG. | solder-mask area (M) | mask-free (F) | M:C | F:C |
|---|---|---|---|---|
| 21 | 2 × regions => 15.4 mm2 | 35.6 mm2 | 30% | 70% |

By reducing and/or minimizing a use of at least one solder-mask region 610, 620 to control, reduce and/or prevent a degree of solder wetting along at least one conductive-trace 500, and by also not using solder-mask 600 in at least one adjacent mask-free region 700, the at least one solder-mask region 610, 620 can be more reliably encapsulated. An improved encapsulation can be particularly advantageous adjacent to one or more electrical components and/or adjacent to one or more electrical connections.

As depicted in the example of FIG. 21, the third conformal-coating region 830 is optionally arranged to fully cover a selection of the one or more conductive-traces 500 comprised in the first surface 210, and to partially cover a selection of the one or more conductive-traces 500 comprised in the first surface 210.

Optionally, the third conformal-coating region 830 is arranged to cover at least a portion of at least one solder-pad 300. In the example of FIG. 21, the third conformal-coating region 830 is optionally arranged to cover and/or fully cover a plurality of pads and/or solder-pads 300.

Optionally, the third conformal-coating region 830 is arranged to cover at least a portion of at least one electrical connection for at least one electrical component. In the example of FIG. 21, the third conformal-coating region 830 is optionally arranged to cover and/or fully cover a plurality of electrical connections. As depicted in the example of FIG. 21, the third conformal-coating region 830 is optionally arranged to fully cover all of the electrical connections, comprised in the first surface 210, for the second electrical component 420.

Optionally, the third conformal-coating region 830 is arranged to cover or fully cover at least a portion of at least one electrical component. In the example of FIG. 21, the third conformal-coating region 830 is optionally arranged to fully cover the second electrical component 420.

Optionally, adhesion of the at least one conformal-coating 800 can be improved by selecting one or more materials which are suitable for adhesion to at least a portion of the first surface 210 in the at least one mask-free region 700 and/or for adhesion to at least a portion of solder-mask 600 in the at least one solder-mask region 600, 610, 620.

Optionally, encapsulation can be improved by further reducing a number and/or an extent of solder-mask regions 600, 610, 620 at least partially covered by the third conformal-coating region 830. For example, one or more solder-mask regions 600, 610, 620 can be replaced by one or more mask-free regions 700. This is particularly advantageous for circuit boards that are to be implanted because a high degree of corrosion resistance can contribute to a higher level of reliability.

For the example depicted in FIG. 21, it can be advantageous to optionally extend the third conformal-coating region 830 to fully cover all pads and solder-pads 300 comprised in the first surface 210.

Optionally, the first conformal-coating 800 can be extended to at least partially cover one or more further solder-mask regions, such as the third solder-mask region 630 and/or he fourth solder-mask region 640. Additionally or alternatively, one or more solder-mask regions 600 can also be arranged to be at least partially trace-free or trace-free. Optionally, at least one solder-mask region 610, 620, 630, 640 can be arranged to be at least partially trace-free or trace-free. Additionally or alternatively, one or more protective coatings can be applied to one or more pads and/or one or more conductive-traces to provide a degree of corrosion protection instead of applying solder-mask 600.

Optionally, the third conformal-coating region 830 can be arranged to cover only a portion of the at least one solder-mask region 600. Optionally, the third conformal-coating region 830 can be arranged to cover only a portion of the first solder-mask region 610.

Optionally, the third conformal-coating region 830 can be optionally arranged to only cover a portion of the electrical connections for the second electrical component 420 and/or a portion of the second electrical component 420. Additionally or alternatively, the third conformal-coating region 830 can be arranged to only cover a portion of the one or more conductive-traces 500.

Figure 22:
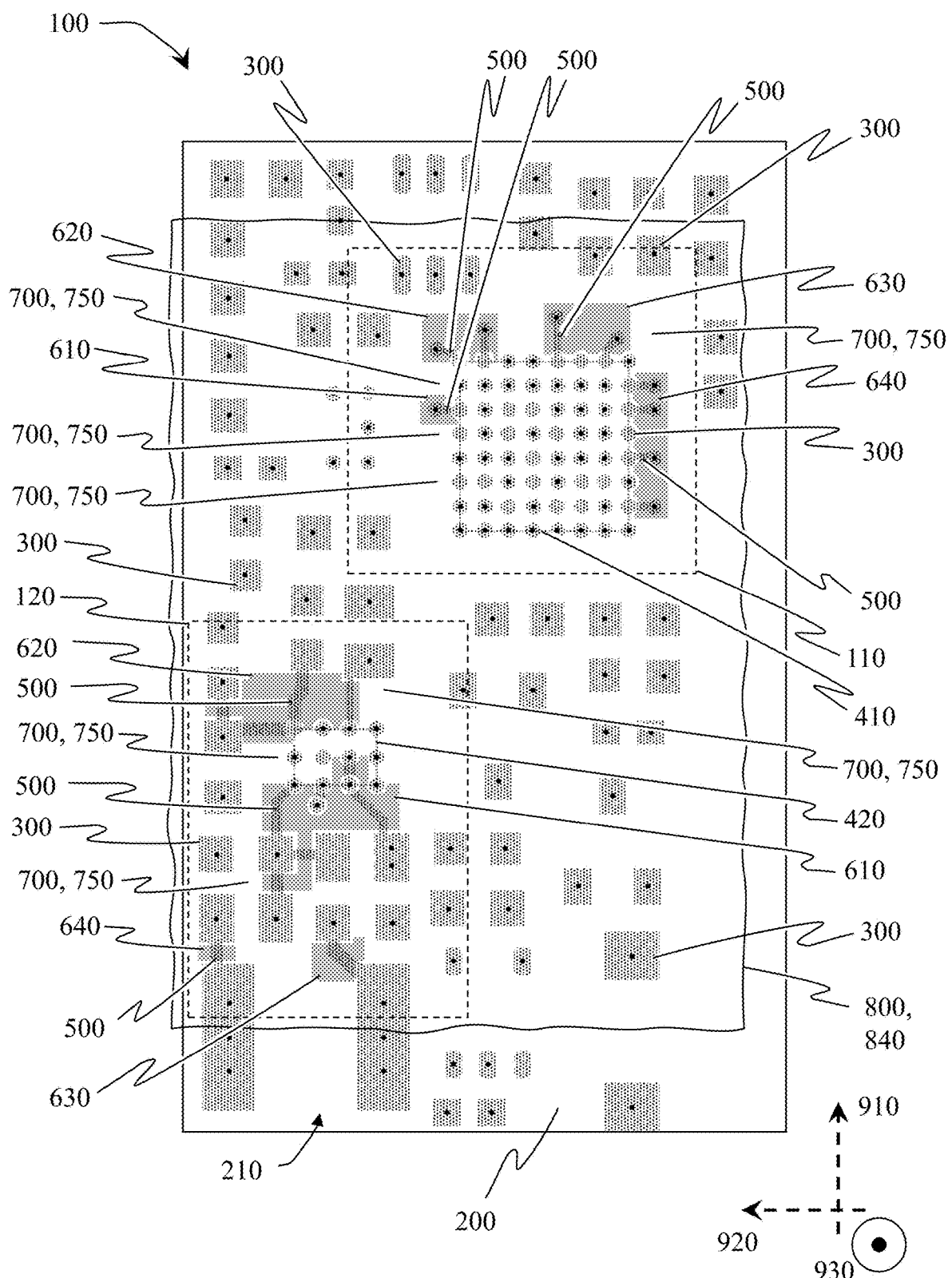
FIG. 22 is an example of a circuit board depicting a top-view of a combination of the pad layout in FIG. 1 and the solder-mask layout in FIG. 2, comprised in a board surface, and after applying a conformal-coating as an example of a conformal-coating region.

FIG. 22 shows view of a circuit board, depicting a top-view of a pad layout and a solder-mask layout, comprised in a board surface. FIG. 22 is the same view as depicted in FIG. 3, but with a different labelling of features. The example depicted in FIG. 22 is a top-view of a combination of the pad layout in FIG. 1 and the solder-mask layout in FIG. 2, comprised in a board surface. In the example of FIG. 22, the circuit board 100 comprises at least one solder-pad 300, at least one conductive-trace 500, at least one region of a solder-mask 600, and at least one mask-free region 700, comprised in the first surface 210. For clarity, only a selection of solder-pads 300, conductive-traces 500, regions of solder-mask 600 and mask-free regions 700 are labelled.

Optionally, at least one mask-free region 700 can be arranged to be at least partially trace-free or trace-free. For clarity, only a selection of the optional one or more trace-free regions 750 are labelled. In the example depicted in FIG. 22, one or more mask-free regions 700 are optionally arranged to also be trace-free regions 750.

In the example of FIG. 22, the circuit board 100 comprises the first board portion 110 as depicted in FIG. 6, and FIG. 17. The first board portion 110 depicted in FIG. 22 is the same as depicted in FIG. 18, but with a different conformal-coating region. The first board portion 110 comprises at least one solder-pad 300, at least one conductive-trace 500, at least one region of a solder-mask 600, and at least one mask-free region 700, comprised in the first surface 210. The first board portion 110 comprises at least one solder-pad 300, comprised in the first surface 210, and is optionally arranged to retain at least one electrical connection of the first electrical component 410. The circuit board 100 also comprises the third board portion (not labelled).

In the example of FIG. 22, the circuit board 100 comprises the second board portion 120 as depicted in FIG. 12. The second board portion 120 depicted in FIG. 22 is the same as depicted in FIG. 21, but with a different conformal-coating region. The second board portion 120 comprises at least one solder-pad 300, at least one conductive-trace 500, at least one region of a solder-mask 600, and at least one mask-free region 700, comprised in the first surface 210. The second board portion 120 comprises at least one solder-pad 300, comprised in the first surface 210, and is optionally arranged to retain at least one electrical connection of the second electrical component 420. The circuit board 100 also comprises the fourth board portion (not labelled).

FIG. 22 is the same view as depicted in FIG. 3, but with a different labelling of features, and after applying at least one conformal-coating 800 as a conformal-coating region, wherein the at least one conformal-coating 800 is in contact with at least a portion of the first surface 210 in at least one mask-free region 700. Also, the at least one conformal-coating 800 is in contact with at least a portion of solder-mask 600 in at least one solder-mask region 600. In the example depicted, the at least one conformal-coating 800 is applied as a fourth conformal-coating region 840, arranged to fully cover the first board portion 110 and to fully cover the second board portion 120. The fourth conformal-coating region is also arranged to fully cover the third board portion (not labelled) and to fully cover the fourth board portion (not labelled).

In the example of FIG. 22, the first board portion 110 comprises the same solder-mask regions as depicted in FIG. 17 and FIG. 18, which are a first solder-mask region 610, a second solder-mask region 620, a third solder-mask region 630, a fourth solder-mask region 640. The first board portion 110 comprises the same mask-free regions 700 as depicted in FIG. 17 and FIG. 18. In the example of FIG. 22, the fourth conformal-coating region 840 is optionally arranged to fully cover the first solder-mask region 610, the second solder-mask region 620, the third solder-mask region 630, the fourth solder-mask region 640, and at least one mask-free region 700 comprised in the first board portion 110. In the first board portion 110, at least the first solder-mask region 610, the second solder-mask region 620, the third solder-mask region 630, and the fourth solder-mask region 640 form islands of solder-mask 600 under the fourth conformal-coating region 840, wherein at least a portion of at least one adjacent mask-free region 700 extends along a perimeter of each solder-mask region 610, 620, 630, 640.

In the example of FIG. 22, the second board portion 120 comprises the same solder-mask regions as depicted in FIG. 21, which are a first solder-mask region 610, a second solder-mask region 620, a third solder-mask region 630, and a fourth solder-mask region 640. The second board portion 120 comprises the same mask-free regions 700 as depicted in FIG. 21. In the example of FIG. 22, the fourth conformal-coating region 840 is optionally arranged to fully cover the first solder-mask region 610, the second solder-mask region 620, the third solder-mask region 630, the fourth solder-mask region 640, and at least one mask-free region 700 comprised in the second board portion 120. In the second board portion 120, at least the first solder-mask region 610, the second solder-mask region 620, the third solder-mask region 630, and the fourth solder-mask region 640 form islands of solder-mask 600 under the fourth conformal-coating region 840, wherein at least a portion of at least one adjacent mask-free region 700 extends along a perimeter of each solder-mask region 610, 620, 630, 640.

In the example depicted in FIG. 22, different areas of solder-mask 600, 610, 620, 639, 640 are covered by the fourth conformal-coating region 840. Similar to the calculation used for the examples depicted in FIG. 23A to FIG. 23T, the fourth conformal-coating region 840 is arranged to cover a conformal-coating area (C) of at least a portion of the first surface 210, and the fourth conformal-coating region 840 is arranged to cover a solder-mask area (M) of the solder-mask regions 600, 610, 620, 630, 640. Additionally or alternatively, the fourth conformal-coating region 840 can be arranged to cover a mask-free area (F) of the at least one mask-free region 700. For clarity, the solder-mask regions 600, 610, 620, 630, 640 are indicated as one or more non-contiguous dark-gray squares. In this example, all regions not comprising a solder-mask region 600, 610, 620, 630, 640 are assumed to be mask-free regions 700, and are indicated with no color. The solder-mask area (M) and the conformal-coating area (C) can be measured in any suitable units, such as square millimeters (mm2).

For the example of FIG. 22, the conformal-coating area (C) is 416.3 mm2.

For the solder-mask regions 600 comprised in the first board portion 110, the first solder-mask region 610 is 1.0 mm2, the second solder-mask region 620 is 3.5 mm$^2$, the third solder-mask region 630 is 4.1 mm2, and the fourth solder-mask region 640 is 4.7 mm2. All four solder-mask regions 600 comprised in the first board portion 110 are covered, forming a total solder-mask area of 4× regions=>13.3 mm2.

For the solder-mask regions 600 comprised in the second board portion 120, the first solder-mask region 610 is 9.4 mm2, the second solder-mask region 620 is 7.4 mm$^2$, the third solder-mask region 630 is 1.9 mm$^2$, and the fourth solder-mask region 640 is 0.6 mm2. All four solder-mask regions 600 comprised in the second board portion 120 are covered, forming a total solder-mask area of 4× regions=>19.3 mm2.

| FIG. | solder-mask area (M) | mask-free (F) | M:C | F:C |
|---|---|---|---|---|
| 22 | 8 × regions => 32.6 mm2 | 383.7 mm2 | 08% | 92% |

By reducing and/or minimizing a use of at least one solder-mask region 600, 610, 620, 630, 640 to control, reduce and/or prevent a degree of solder wetting along at least one conductive-trace 500, and by also not using solder-mask 600 in at least one adjacent mask-free region 700, the at least one solder-mask region 600, 610, 620, 630, 640 can be more reliably encapsulated. An improved encapsulation can be particularly advantageous adjacent to one or more electrical components and/or adjacent to one or more electrical connections.

As depicted in the example of FIG. 22, the fourth conformal-coating region 840 is optionally arranged to fully cover all of the one or more conductive-traces 500 comprised in the first surface 210

Optionally, the fourth conformal-coating region 840 is arranged to cover at least a portion of at least one solder-pad 300. In the example of FIG. 22, the fourth conformal-coating region 840 is optionally arranged to cover and/or fully cover a plurality of pads and/or solder-pads 300.

Optionally, the fourth conformal-coating region 840 is arranged to cover at least a portion of at least one electrical connection for at least one electrical component. In the example of FIG. 22, the fourth conformal-coating region 840 is optionally arranged to cover and/or fully cover a plurality of electrical connections. As depicted in the example of FIG. 22, the fourth conformal-coating region 840 is optionally arranged to fully cover all of the electrical connections, comprised in the first surface 210, for the first electrical component and the second electrical component 420.

Optionally, the fourth conformal-coating region 840 is arranged to fully cover the first electrical component 410 and the second electrical component 420.

Optionally, adhesion of the at least one at least one conformal-coating 800 can be improved by selecting one or more materials which are suitable for adhesion to at least a portion of the first surface 210 in the at least one mask-free region 700 and/or for adhesion to at least a portion of solder-mask 600 in the at least one solder-mask region 600, 610, 620, 630, 640.

Optionally, encapsulation can be improved by further reducing a number and/or an extent of solder-mask regions 600, 610, 620, 630, 640 covered by the fourth conformal-coating region 840. For example, one or more solder-mask regions 600, 610, 620, 630, 640 can be replaced by one or more mask-free regions 700. This is particularly advantageous for circuit boards that are to be implanted because a high degree of corrosion resistance can contribute to a higher level of reliability.

For the example depicted in FIG. 22, it can be advantageous to optionally extend the fourth conformal-coating region 840 to fully cover all pads and solder-pads 300 comprised in the first surface 210.

Optionally, one or more solder-mask regions 600, 610, 620, 630, 640 can also be arranged to be at least partially trace-free or trace-free.

Additionally or alternatively, one or more protective coatings can be applied to one or more pads and/or one or more conductive-traces to provide a degree of corrosion protection instead of applying solder-mask 600.

Optionally, the fourth conformal-coating region 840 can be arranged to cover only a portion of the at least one solder-mask region 600, 610, 620, 630, 640.

Optionally, the fourth conformal-coating region 840 can be optionally arranged to only cover a portion of the electrical connections for the first electrical component 410 and/or the second electrical component 420. Additionally or alternatively, the fourth conformal-coating region 840 can be optionally arranged to cover only a portion of the first electrical component 410 and/or the second electrical component 420. Additionally or alternatively, the fourth conformal-coating region 840 can be arranged to only cover a portion of the one or more conductive-traces 500.

Figure 23A:
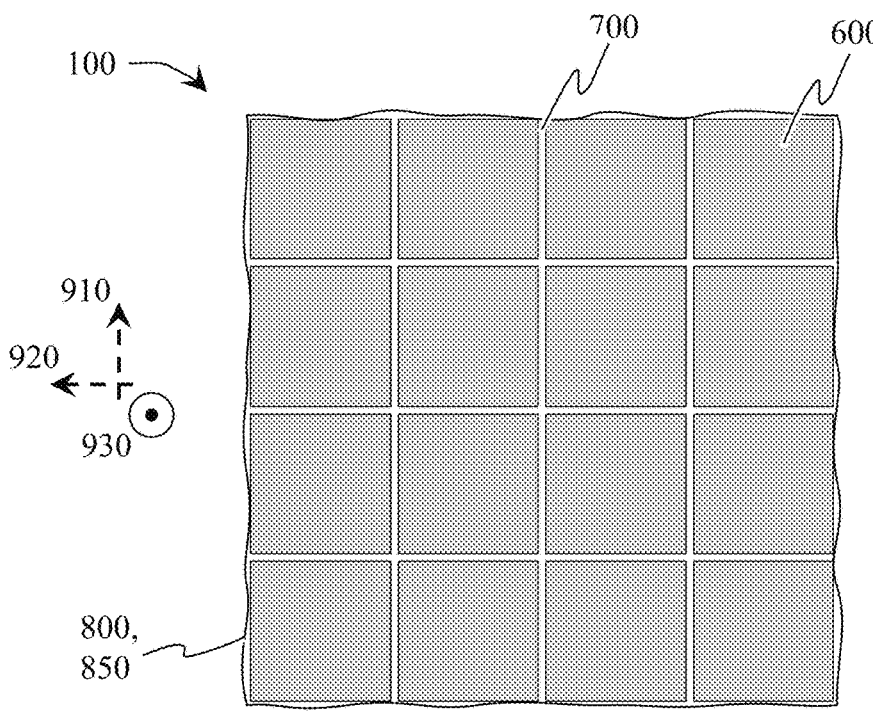
FIG. 23 schematically depicts several enlarged top views of a portion of the circuit board in FIG. 1, with different areas in mm2 of solder-mask covered by a region of at least one conformal coating.
Figure 23B:
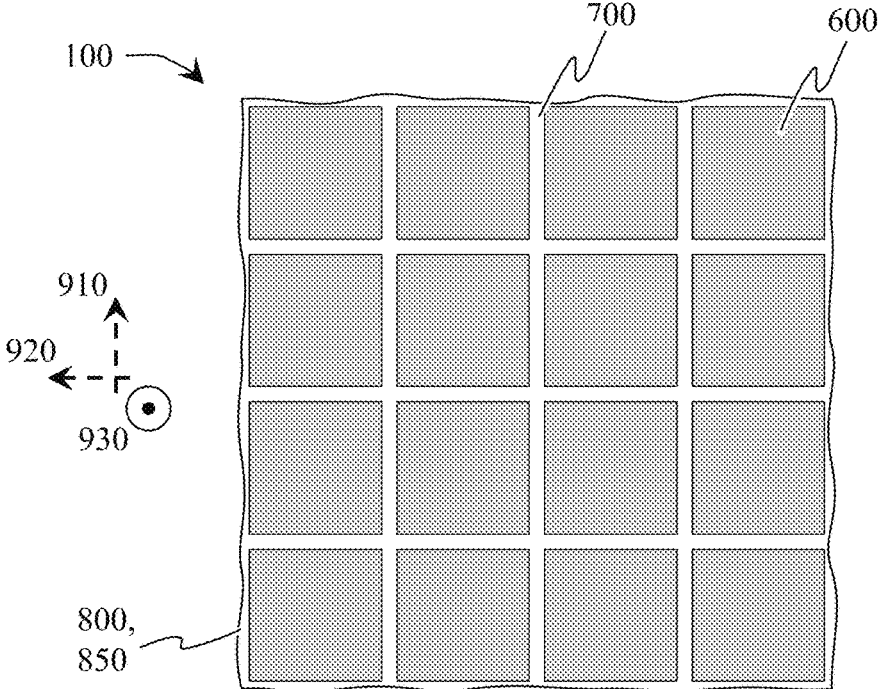
Figure 23C:
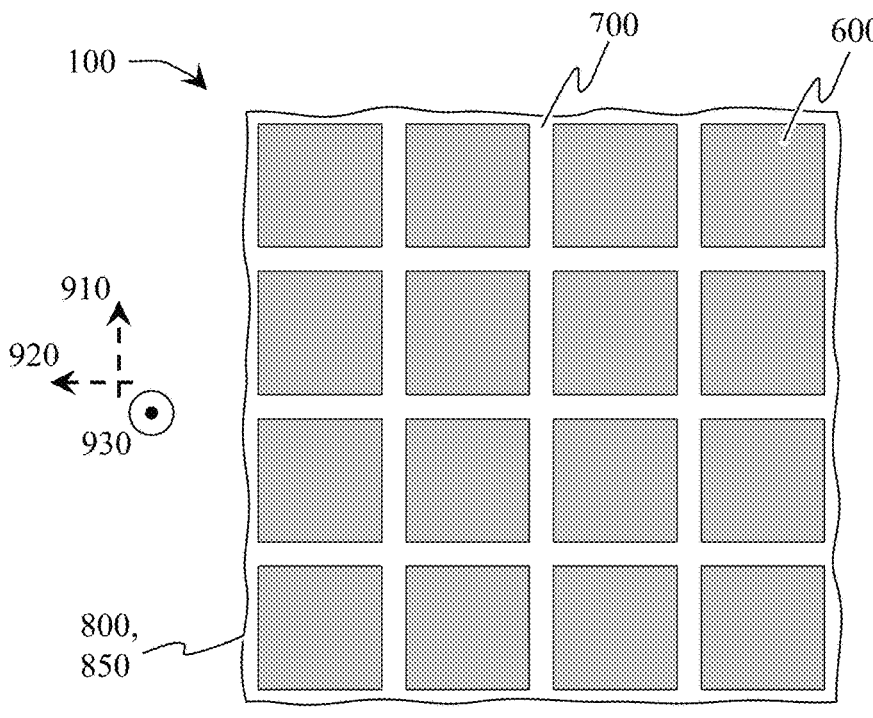
Figure 23D:
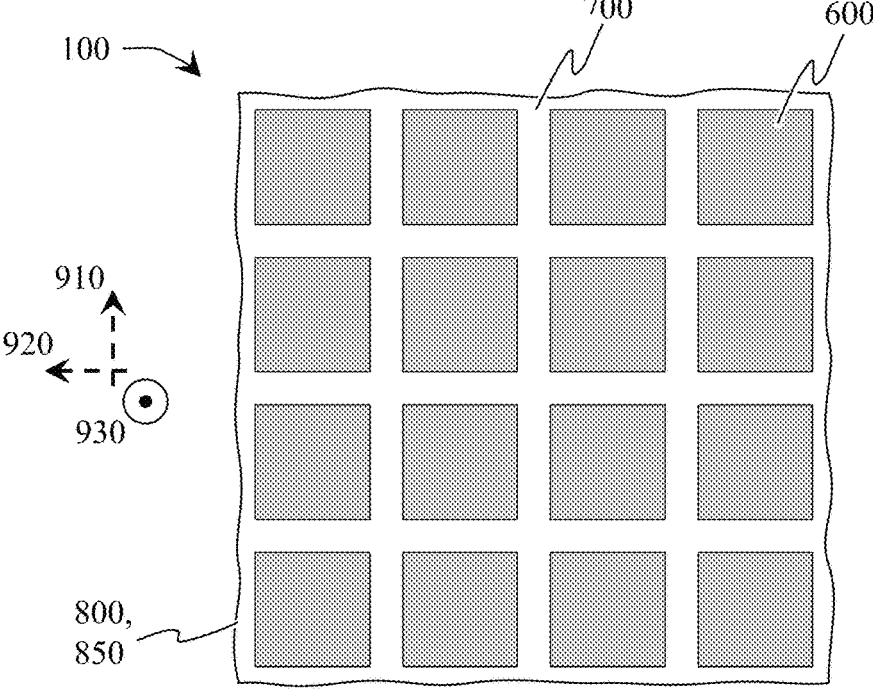
Figure 23E:
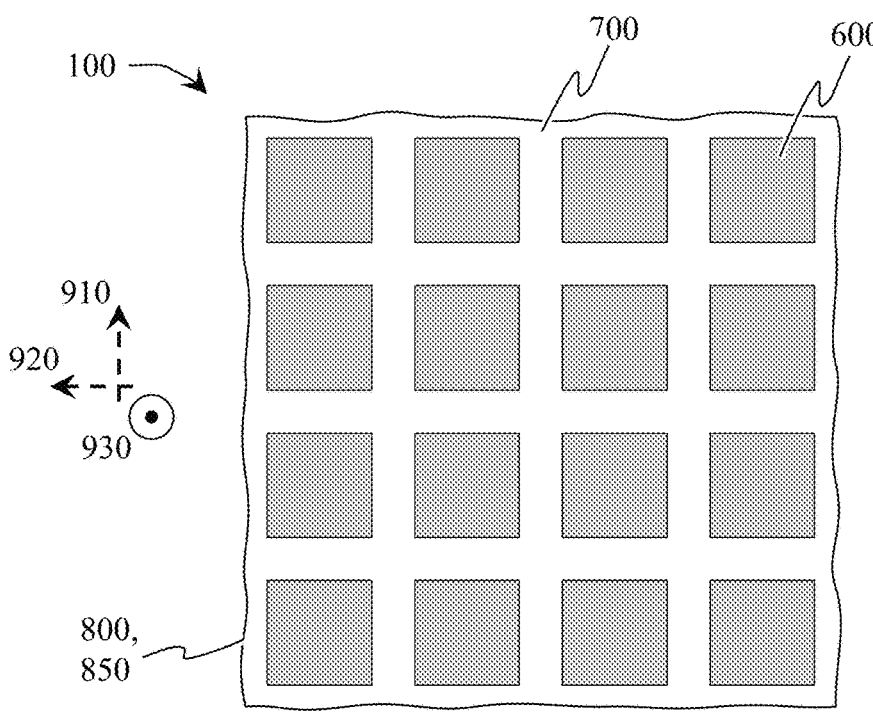
Figure 23F:
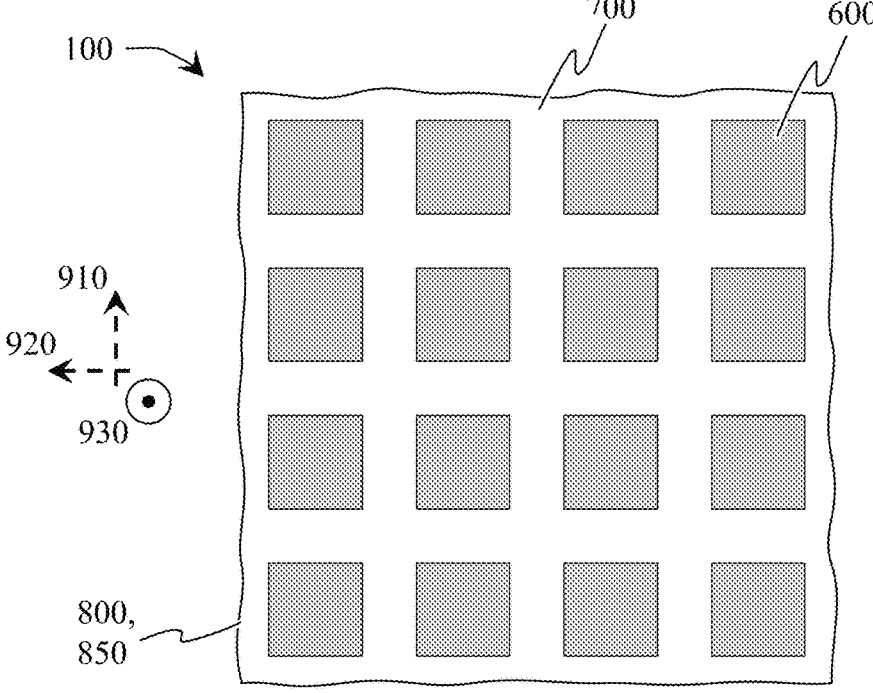
Figure 23G:
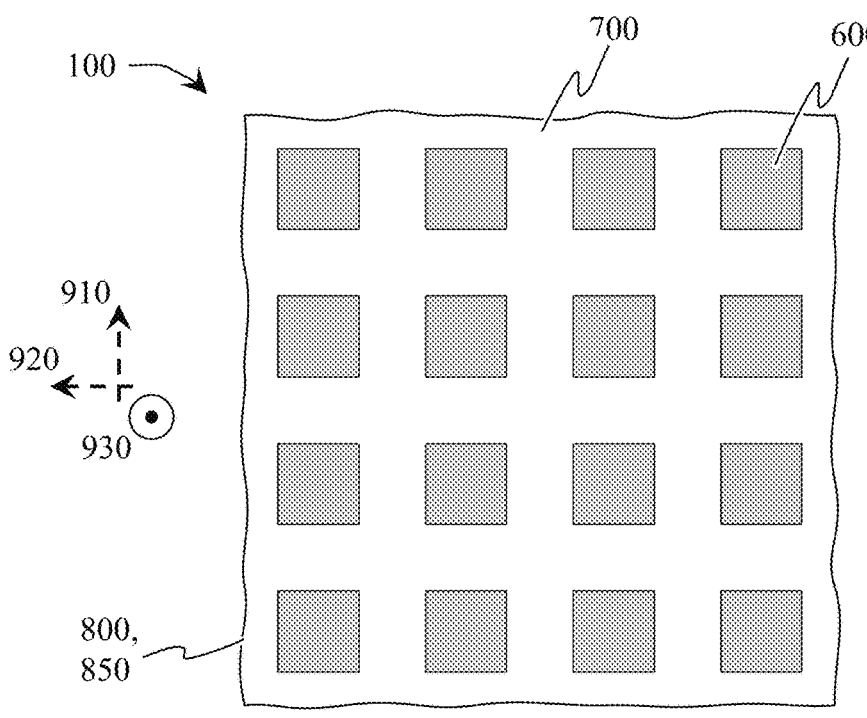
Figure 23H:
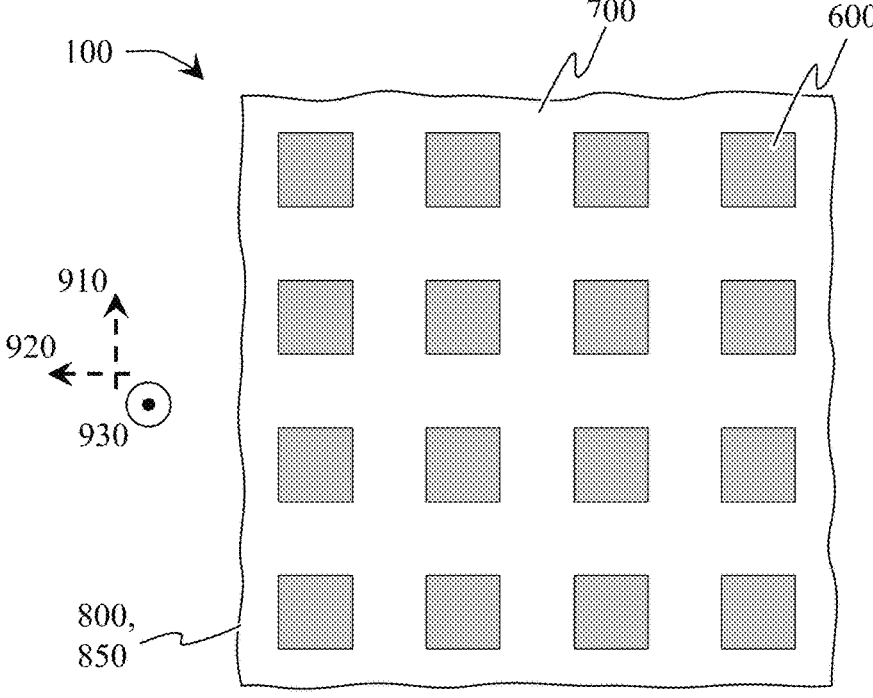
Figure 23I:
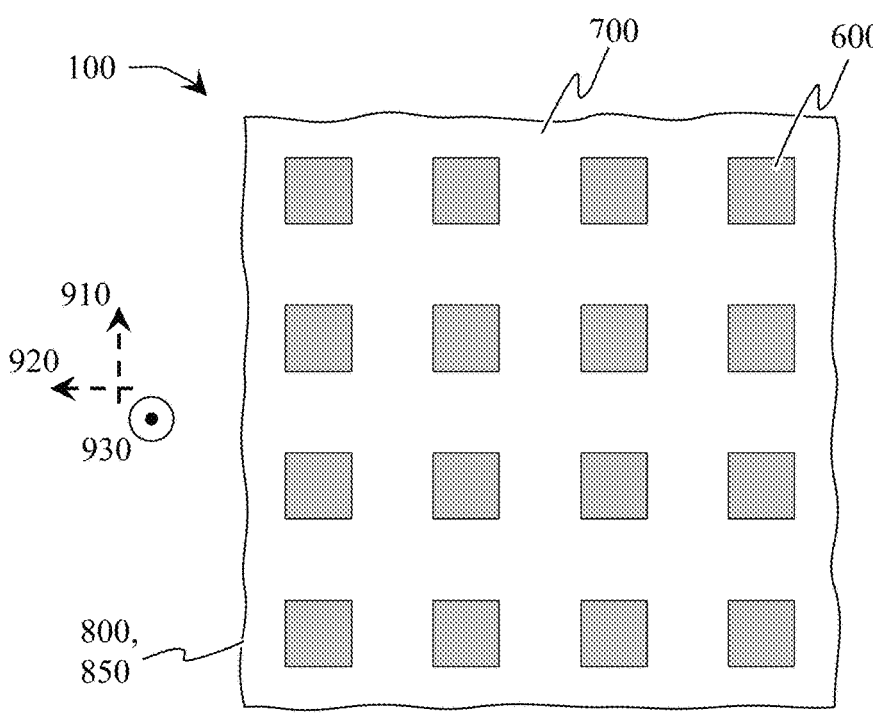
Figure 23J:
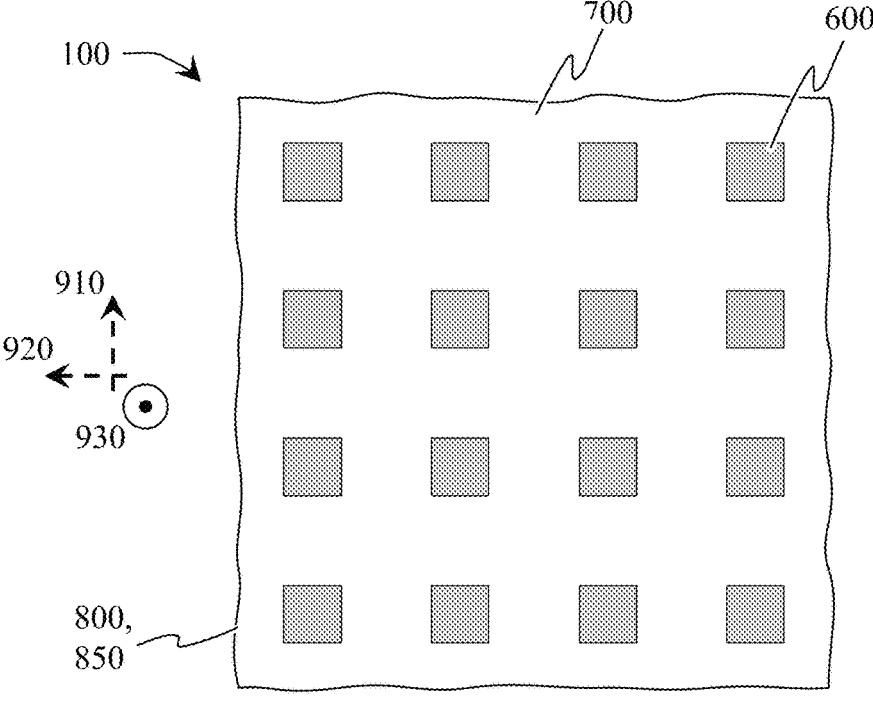
Figure 23K:
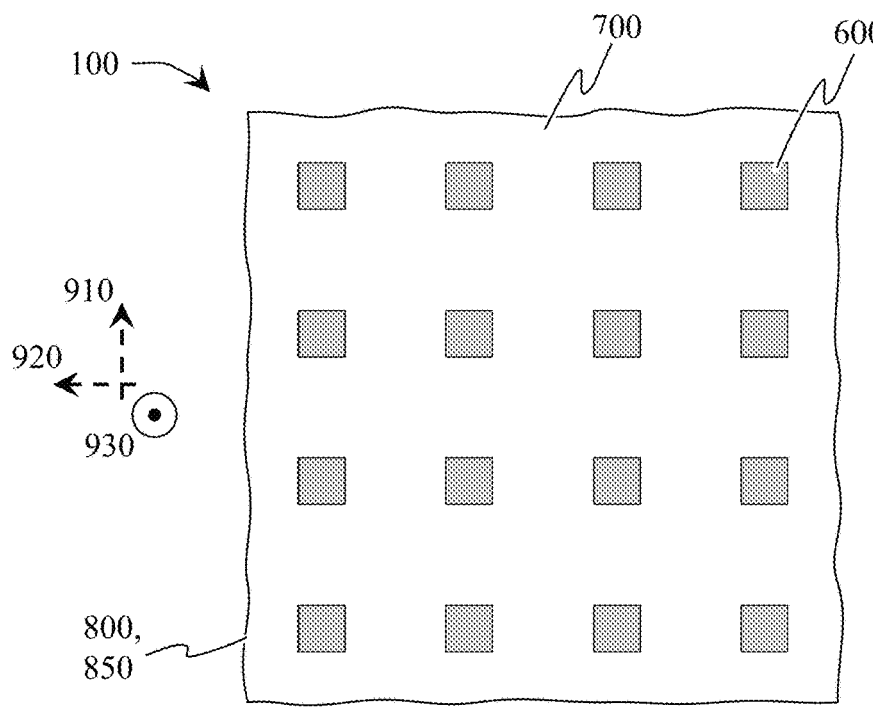
Figure 23L:
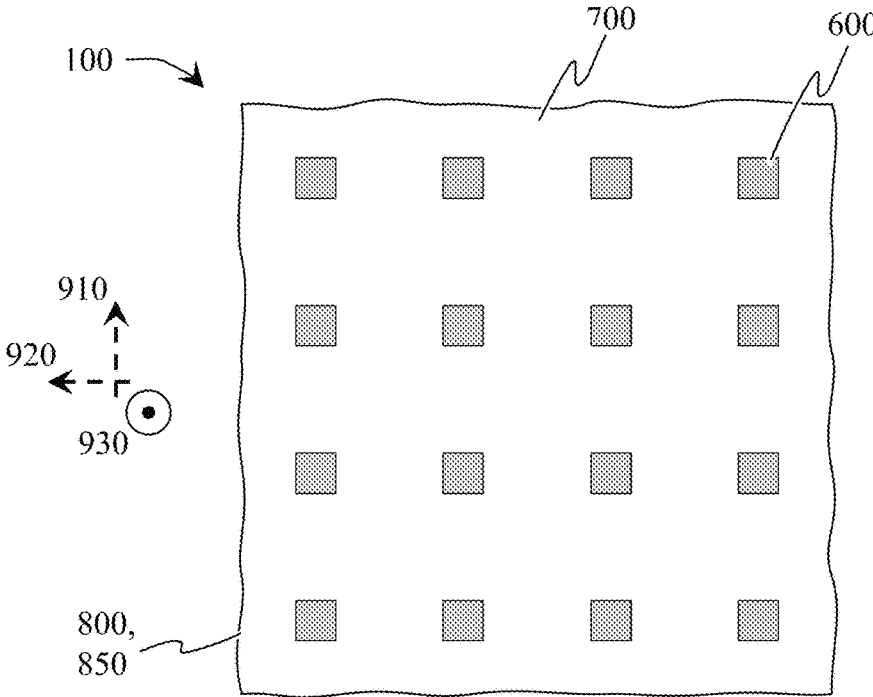
Figure 23M:
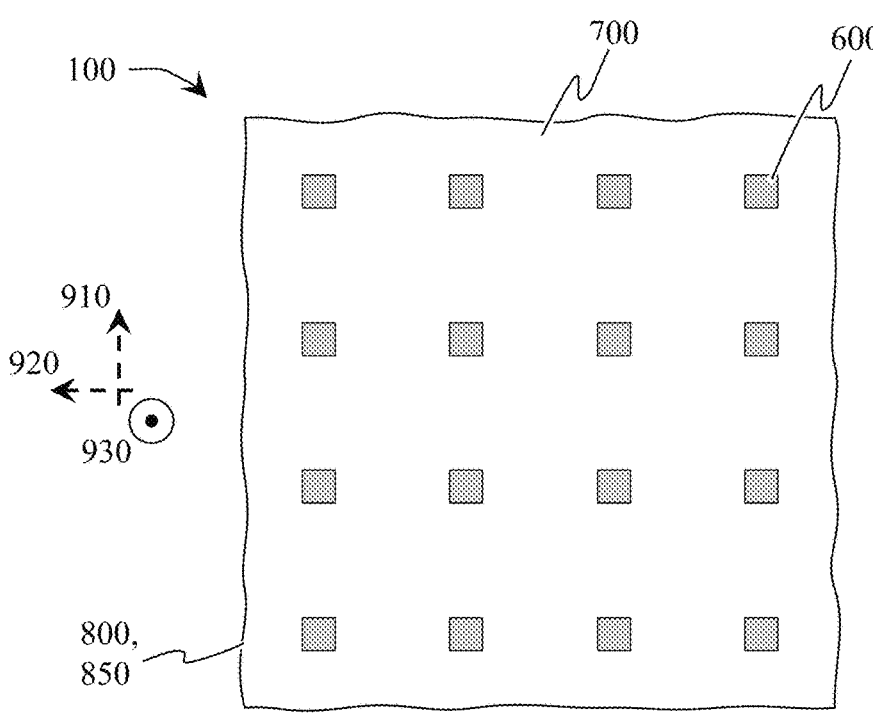
Figure 23N:
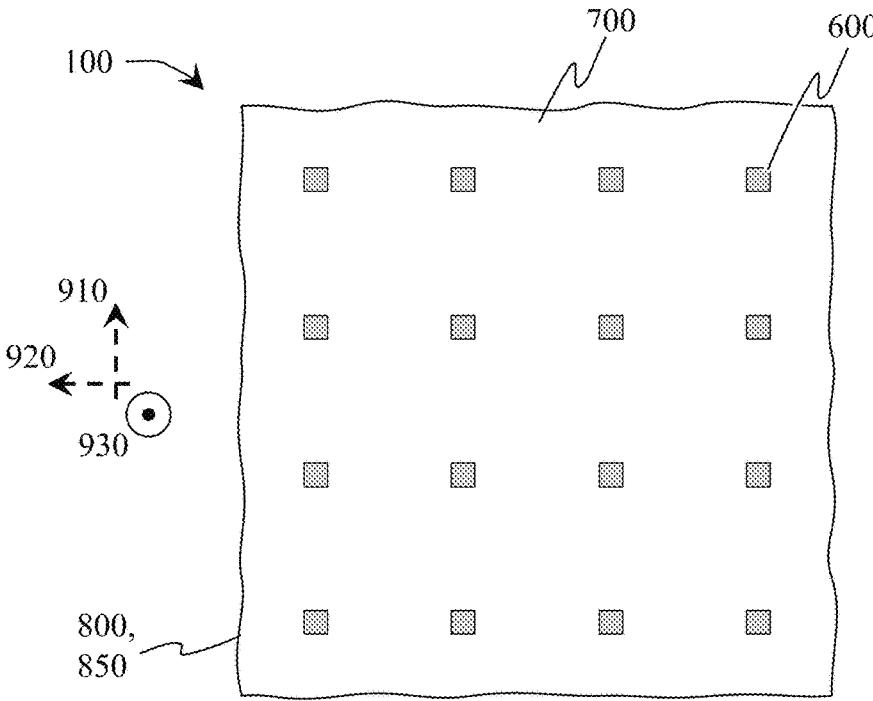
Figure 23O:
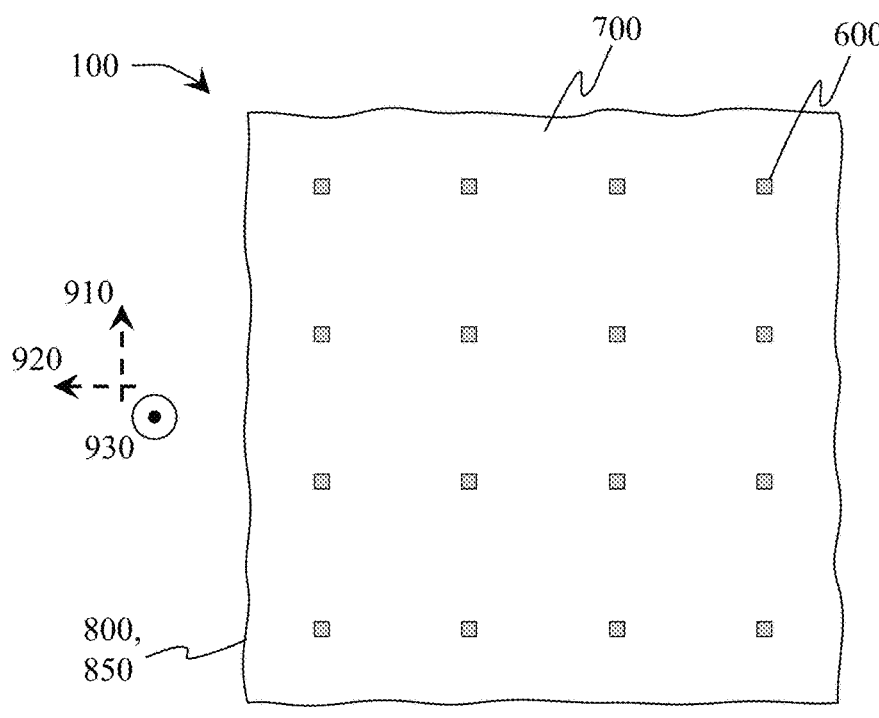
Figure 23P:
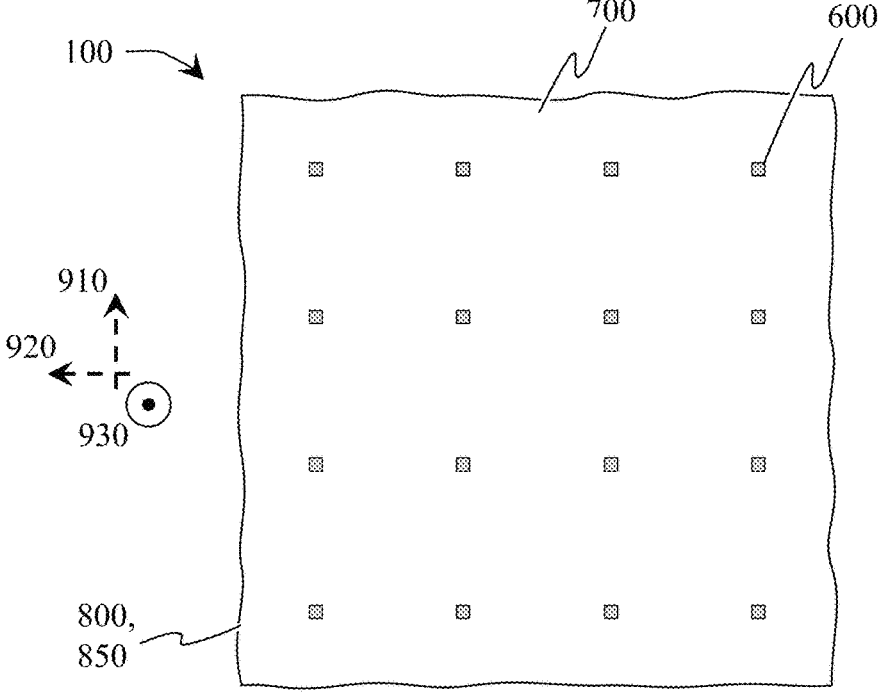
Figure 23Q:
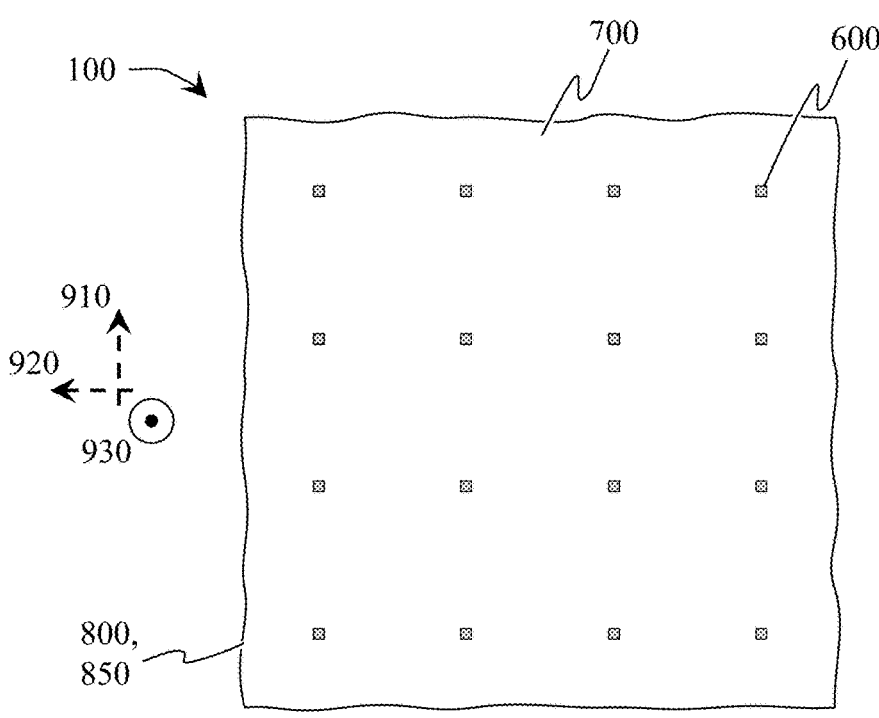
Figure 23R:
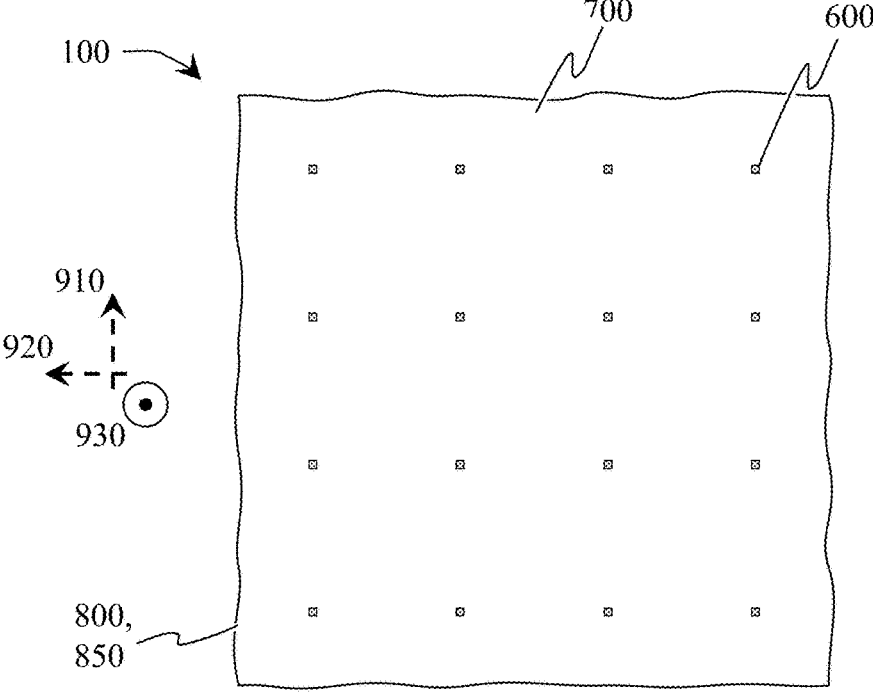
Figure 23S:
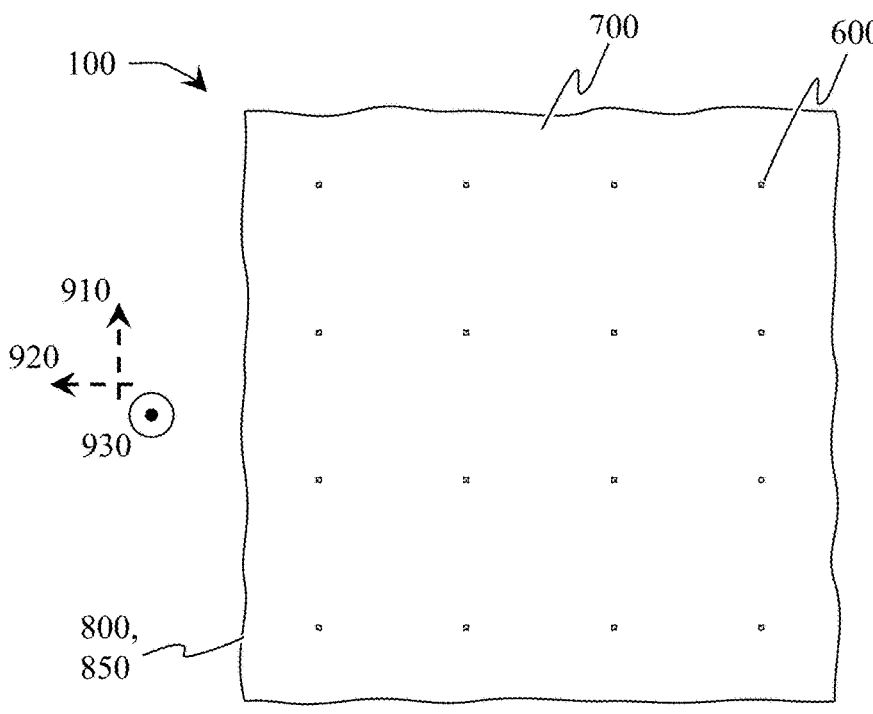
Figure 23T:
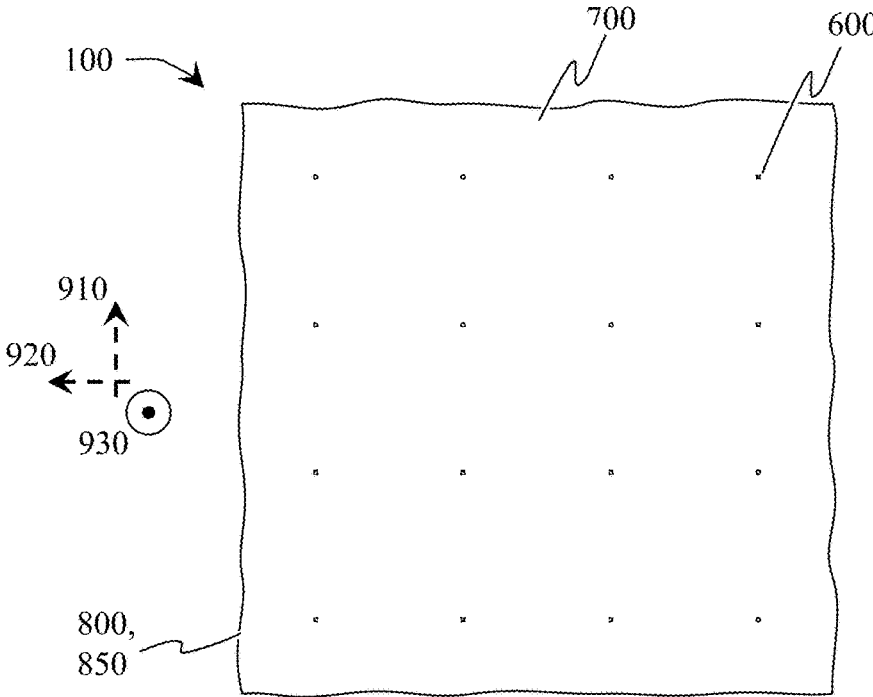

FIG. 23A to FIG. 23T depict several enlarged top views of a portion of the circuit board in FIG. 1, with different areas of solder-mask 600 covered by a region of at least one conformal coating 800. FIG. 23A to FIG. 23T show several top views after applying at least one conformal-coating 800 as a fifth conformal-coating region 850. The at least one conformal-coating 800 is in contact with at least a portion of the first surface (not labelled) in at least one mask-free region 700. Also, the at least one conformal-coating 800 is in contact with at least a portion of solder-mask 600 in at least one solder-mask region 600. For clarity, only one of the solder-mask regions 600 and one of the mask-free regions 700 are labelled. In the examples depicted, the at least one solder-mask regions 600 optionally form islands of solder-mask 600 under the fifth conformal-coating region 850, wherein at least a portion of at least one adjacent mask-free region 700 extends along a perimeter of the at least one solder-mask region 600.

Optionally, encapsulation can be improved by reducing a number and/or an extent of solder-mask regions 600 at least partially covered by the fifth conformal-coating region 850. For example, the at least one conformal-coating 800 can be arranged to cover a conformal-coating area (C) of at least a portion of the first surface (not labelled), and the at least one conformal-coating 800 can be arranged to cover a solder-mask area (M) of the at least one solder-mask region 600.

Additionally or alternatively, the at least one conformal-coating 800 can be arranged to cover a mask-free area (F) of the at least one mask-free region 700.

FIG. 23A to FIG. 23T schematically show different degrees of reduction in the solder-mask area (M). For clarity, the at least one solder-mask region 600 is indicated as one or more non-contiguous dark-gray squares. In these examples, all regions not comprising a solder-mask region 600 are assumed to be mask-free regions 700, and are indicated with no color. The solder-mask area (M) and the conformal-coating area (C) can be measured in any suitable units, such as square millimeters (mm2). For each of these examples, the conformal-coating area (C) is 100 mm2.

| FIG. | solder-mask area (M) | mask-free (F) | M:C | F:C |
|---|---|---|---|---|
| 22 | 8 × regions => 32.6 mm2 | 383.7 mm2 | 08% | 92% |
| 23A | 16 × 5.625 mm2 => 90.00 mm2 | 10.00 mm2 | 90.00% | 10.00% |
| 23B | 16 × 5.000 mm2 => 80.00 mm2 | 20.00 mm2 | 80.00% | 20.00% |
| 23C | 16 × 4.375 mm2 => 70.00 mm2 | 30.00 mm2 | 70.00% | 30.00% |
| 23D | 16 × 3.750 mm2 => 60.00 mm2 | 40.00 mm2 | 60.00% | 40.00% |
| 23E | 16 × 3.125 mm2 => 50.00 mm2 | 50.00 mm2 | 50.00% | 50.00% |
| 23F | 16 × 2.500 mm2 => 40.00 mm2 | 60.00 mm2 | 40.00% | 60.00% |
| 23G | 16 × 1.875 mm2 => 30.00 mm2 | 70.00 mm2 | 30.00% | 70.00% |
| 23H | 16 × 1.563 mm2 => 25.00 mm2 | 75.00 mm2 | 25.00% | 75.00% |
| 23I | 16 × 1.250 mm2 => 20.00 mm2 | 80.00 mm2 | 20.00% | 80.00% |
| 23J | 16 × 0.938 mm2 => 15.00 mm2 | 85.00 mm2 | 15.00% | 85.00% |
| 23K | 16 × 0.625 mm2 => 10.00 mm2 | 90.00 mm2 | 10.00% | 90.00% |
| 23L | 16 × 0.469 mm2 => 07.50 mm2 | 92.50 mm2 | 07.50% | 92.50% |
| 23M | 16 × 0.313 mm2 => 05.00 mm2 | 95.00 mm2 | 05.00% | 95.00% |
| 23N | 16 × 0.156 mm2 => 02.50 mm2 | 97.50 mm2 | 02.50% | 97.50% |
| 23O | 16 × 0.063 mm2 => 01.00 mm2 | 99.00 mm2 | 01.00% | 99.00% |
| 23P | 16 × 0.047 mm2 => 00.75 mm2 | 99.25 mm2 | 00.75% | 99.25% |
| 23Q | 16 × 0.031 mm2 => 00.50 mm2 | 99.50 mm2 | 00.50% | 99.50% |
| 23R | 16 × 0.016 mm2 => 00.25 mm2 | 99.75 mm2 | 00.25% | 99.75% |
| 23S | 16 × 0.006 mm2 => 00.10 mm2 | 99.90 mm2 | 00.10% | 99.90% |
| 23T | 16 × 0.003 mm2 => 00.05 mm2 | 99.95 mm2 | 00.05% | 99.95% |

Encapsulation can be improved if the solder-mask area (M) compared to the conformal-coating area (C) (ratio M:C), is in the range of 1% to 50%, or 1% to 40%, or 1% to 30%, or 1% to 25%, or 1% to 20%, or 1% to 15%, or 1% to 10%, or 1% to 7.5%, or 1% to 5%, or 1% to 2.5%, or approximately 1%.

Additionally or alternatively, encapsulation can be improved if the mask-free area (F) compared to the conformal-coating area (C) (ratio F:C), is approximately 998, or in the range of 99% to 97.5%, or 99% to 95%, 15 or 99% to 92.5%, or 99% to 90%, or 99% to 85%, or 99% to 80%, or 99% to 75%, or 99% to 70%, or 99% to 60%, or 99% to 50%.

The solder-mask area (M) can comprise one or more contiguous and/or non-contiguous solder-mask regions 600. Additionally or alternatively, the mask-free area (F) can comprise one or more contiguous and/or non-contiguous mask-free regions 700. Additionally or alternatively, the conformal-coating area (C) can comprise one or more contiguous and/or non-contiguous regions of at least one conformal-coating 800.

It can therefore be advantageous to arrange the solder-mask area (M) to be as small as possible compared to the conformal-coating area (C). Additionally or alternatively, it can be advantageous to arrange the mask-free area (F) to be as large as possible compared to the conformal-coating area (C). For example, one or more solder-mask regions 600, 610, 620, 630, 640 can be replaced by one or more mask-free regions 700. This is particularly advantageous for circuit boards that are to be implanted because a high degree of corrosion resistance can contribute to a higher level of reliability.

Reference numbers used are 100 circuit board, 110 first board portion, 120 second board portion, 130 third board portion, 140 fourth board portion, 150 fifth board portion, 200 substrate, 210 first surface, 220 second surface, 300 solder-pad, 310 first solder-pad, 310*a* first example of a first solder-pad, 310*b* second example of a first solder-pad, 310*c* third example of a first solder-pad, 320 second solder-pad, 320*a* first example of a second solder-pad, 320*b* second example of a second solder-pad, 320*c* third example of a second solder-pad, 330 third pad, 330*a* a first example of a third pad, 330*b* a second example of a third pad, 330*c* a third example of a third pad, 410 first electrical component, 420 second electrical component, 500 conductive-trace, 510 first conductive-trace, 510*a* first example of a first conductive-trace, 510*b* second example of a first conductive-trace, 510*c* third example of a first conductive-trace, 600 solder-mask, 610 first solder-mask region, 610*a* first example of a first solder-mask region, 610*b* second example of a first solder-mask region, 610*c* third example of a first solder-mask region, 620 second solder-mask region, 630 third solder-mask region, 640 fourth solder-mask region, 700 mask-free region, 710 first mask-free region, 710*a* first example of a first mask-free region, 710*b* second example of a first mask-free region, 710*c* third example of a first mask-free region, 720 second mask-free region, 720*a* first example of a second mask-free region, 720*b* second example of a second mask-free region, 720*c* third example of a second mask-free region, 750 trace-free region, 750*a* first example of a trace-free region, 750*b* second example of a trace-free region, 750*c* third example of a trace-free region, 800 at least one conformal-coating, 810 first conformal-coating region, 820 second conformal-coating region, 830 third conformal-coating region, 840 fourth conformal-coating region, 850 fifth conformal-coating region, 910 first axis, 920 second axis, and 930 third axis.

The invention claimed is:

1. A circuit board comprising at least one substrate with a first surface, wherein the circuit board comprises at least one conformal-coating arranged to cover at least a portion of the first surface;
   wherein the first surface comprises at least one first solder-pad and at least one second solder-pad, each being arranged to retain at least one electrical connection of an electrical component;
   wherein the first surface comprises at least one third pad;
   wherein the first surface comprises at least one conductive-trace extending between the at least one first solder-pad and the at least one third pad;
   wherein the first surface comprises at least one solder-mask region, arranged to cover at least a portion of the at least one conductive-trace;
   wherein the first surface comprises at least one mask-free region, adjacent to the at least one second solder-pad;
   wherein the at least one conformal-coating is in contact with at least a portion of the first surface in the at least one mask-free region; and
   wherein the at least one conformal-coating is in contact with at least a portion of solder-mask in the at least one solder-mask region.

2. The circuit board according to claim 1, wherein the circuit board is arranged to be at least partially implantable.

3. The circuit board according to claim 1, wherein the at least one solder-mask region is arranged to cover at least a portion of the third pad.

4. The circuit board according to claim 1, wherein the at least one conformal-coating is arranged to cover at least a portion of the at least one first solder-pad, such that the at least one conformal-coating is in contact with at least a portion of the at least one first solder-pad.

5. The circuit board according to claim 1, wherein the at least one conformal-coating is arranged to cover at least a portion of the at least one second solder-pad, such that the at least one conformal-coating is in contact with at least a portion of the at least one second solder-pad.

6. The circuit board according to claim 1, wherein the at least one conformal-coating is arranged to cover at least a portion of the at least one third pad, such that the at least one conformal-coating is in contact with at least a portion of the at least one third pad.

7. The circuit board according to claim 1, wherein the at least one first solder-pad and the at least one second solder-pad are arranged to be adjacent, or immediately adjacent, to each other.

8. The circuit board according to claim 1, wherein the at least one second solder-pad is arranged to be adjacent to at least one trace-free region.

9. The circuit board according to claim 1, wherein the first surface comprises at least one further mask-free region, arranged between the at least one solder-mask region and the at least one first solder-pad.

10. The circuit board according to claim 9, wherein the at least one further mask-free region is arranged to provide a minimum separation of at least 0.04 mm between the at least one solder-mask region and the at least one first solder-pad.

11. The circuit board according to claim 1, wherein the at least one mask-free region, at least one further mask-free region, the at least one solder-mask region, or any combination thereof, are arranged to be at least partially trace-free.

12. The circuit board according to claim 1, wherein the at least one first solder-pad comprises at least one through-hole and/or at least one via.

13. The circuit board according to claim 1, wherein the at least one second solder-pad comprises at least one through-hole and/or at least one via.

14. The circuit board according to claim 1, wherein the at least one third pad comprises at least one through-hole and/or at least one via.

15. The circuit board according to claim 1, wherein the third pad is arranged as a solder-pad for retaining at least one electrical connection of an electrical component.

16. The circuit board according to claim 1, wherein the at least one solder-mask region is arranged to be at least partially removable after solder has been applied to at least a portion of the at least one first solder-pad, to at least a portion of the at least one conductive-trace, to at least a portion of the at least one second solder-pad, to at least a portion of the at least one third pad, or any combination thereof.

17. The circuit board according to claim 1, wherein the first solder-pad and/or the second solder-pad are arranged to retain an SMD electrical connection, a BGA electrical connection, a lead electrical connection, or any combination thereof.

18. The circuit board according to claim 1, wherein the at least one conformal-coating is arranged to cover a conformal-coating area of at least a portion of the first surface;
   wherein the at least one conformal-coating is arranged to cover a solder-mask area of one or more portions of the at least one solder-mask region; and
   wherein the solder-mask area compared to the conformal-coating area is in the range of 1% to 50%, or 1% to 40%, or 1% to 30%, or 1% to 25%, or 1% to 20%, or 1% to 15%, or 1% to 10%, or 1% to 7.5%, or 1% to 5%, or 1% to 2.5%, or approximately 18.

19. The circuit board according to claim 1, wherein the at least one conformal-coating is arranged to cover a conformal-coating area of at least a portion of the first surface;

wherein the at least one conformal-coating is arranged to cover a mask-free area of one or more portions of the at least one mask-free region and/or at least one further mask-free region; and wherein the mask-free area compared to the conformal-coating area is approximately 99%, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

20. The circuit board according to claim 1, wherein the at least one conformal-coating is arranged to cover a conformal-coating area of at least a portion of the first surface;

wherein the at least one conformal-coating is arranged to cover a trace-free area of at least a portion of the first surface; and wherein the trace-free area compared to the conformal-coating area is approximately 99%, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

21. The circuit board according to claim 1, wherein the at least one conformal-coating is arranged to cover a conformal-coating area of at least a portion of the first surface;

wherein the at least one conformal-coating is arranged to cover a trace- and mask-free area of at least a portion of the first surface; and wherein the trace- and mask-free area compared to the conformal-coating area is approximately 99%, or in the range of 99% to 97.5%, or 99% to 95%, or 99% to 92.5%, or 99% to 90%, or 99% to 85%, or 99% to 80%, or 99% to 75%, or 99% to 70%, or 99% to 60%, or 99% to 50%.

* * * * *